(12) United States Patent  
Imatani et al.

(10) Patent No.: US 8,963,544 B2  
(45) Date of Patent: Feb. 24, 2015

(54) SIGNAL TRANSMISSION DEVICE

(75) Inventors: Hirofumi Imatani, Kusata (JP); Masaaki Yamamoto, Ibaraki (JP); Mamiko Naka, Moriyama (JP); Yasushi Kaneta, Sendai (JP); Kiwamu Shirakawa, Sendai (JP)

(73) Assignee: The Research Institute for Electric and Magnetic Materials, Miyagi (JP)

( * ) Notice: Subject to any disclaimer, the term of this patent is extended or adjusted under 35 U.S.C. 154(b) by 522 days.

(21) Appl. No.: 13/062,818

(22) PCT Filed: Sep. 29, 2009

(86) PCT No.: PCT/JP2009/066948
§ 371 (c)(1),
(2), (4) Date: Apr. 27, 2011

(87) PCT Pub. No.: WO2010/035873
PCT Pub. Date: Apr. 1, 2010

(65) Prior Publication Data
US 2011/0273174 A1   Nov. 10, 2011

(30) Foreign Application Priority Data

Sep. 29, 2008 (JP) .................................. 2008-251594

(51) Int. Cl.
*G01R 33/02* (2006.01)
*G01B 7/14* (2006.01)
(Continued)

(52) U.S. Cl.
CPC ............... *G01R 33/093* (2013.01); *B82Y 25/00* (2013.01); *G01R 33/0011* (2013.01); *H01L 43/08* (2013.01)
USPC ...... 324/252; 324/207.21; 324/249; 360/324; 427/8; 257/422

(58) Field of Classification Search
USPC .................................................. 324/237, 252
See application file for complete search history.

(56) References Cited

U.S. PATENT DOCUMENTS 3,987,485 A * 10/1976 Sugaya et al. .................. 360/63
4,097,802 A *  6/1978 Mazzeo et al. ................ 324/252
(Continued)

FOREIGN PATENT DOCUMENTS

| CN | 1394284 A | 1/2003 |
| CN | 1770315 A | 5/2006 |

(Continued)

OTHER PUBLICATIONS

Office Action for Chinese Application No. 200980132270.5 dated Oct. 31, 2012 (4 pages).
(Continued)

*Primary Examiner* — Jermele M Hollington
*Assistant Examiner* — Christopher McAndrew
(74) *Attorney, Agent, or Firm* — Osha Liang LLP

(57) ABSTRACT

A magnetic detection element includes a magnetoresistance effect portion composed of a magnetoresistance effect material and a pair of yoke portions. The pair of yoke portions is composed of a soft magnetic material and are respectively arranged so as to be electrically connected to both sides of the magnetoresistance effect portion. The pair of yoke portions guides magnetic flux into the magnetoresistance effect portion. The magnetic detection element also includes a bypass portion, which is composed of a soft magnetic material and is saturated with magnetic flux at lower magnetic field intensity than the yoke portions, and which guides a part of the magnetic flux generated in the yoke portions so as to divert the magnetic flux from the magnetoresistance effect portion.

50 Claims, 12 Drawing Sheets

(51) Int. Cl.
*G11B 5/127* (2006.01)
*C23C 16/52* (2006.01)
*H01L 29/82* (2006.01)
*G01R 33/09* (2006.01)
*B82Y 25/00* (2011.01)
*G01R 33/00* (2006.01)
*H01L 43/08* (2006.01)

(56) References Cited

U.S. PATENT DOCUMENTS

| | | | |
|---|---|---|---|
| 4,301,418 A * | 11/1981 | Gordon et al. | 330/62 |
| 4,568,906 A * | 2/1986 | De Wilde et al. | 338/32 R |
| 4,613,918 A * | 9/1986 | Kanai et al. | 360/320 |
| 4,617,600 A * | 10/1986 | Somers | 360/321 |
| 5,453,291 A * | 9/1995 | Sasahara et al. | 427/8 |
| 5,552,589 A * | 9/1996 | Smith et al. | 235/449 |
| 5,729,137 A * | 3/1998 | Daughton et al. | 324/252 |
| 6,101,072 A * | 8/2000 | Hayashi | 360/324 |
| 6,172,858 B1 * | 1/2001 | Yoda et al. | 360/313 |
| 6,519,124 B1 | 2/2003 | Redon et al. | |
| 6,642,714 B2 | 11/2003 | Kobayashi et al. | |
| 6,661,606 B2 * | 12/2003 | Sano et al. | 360/125.01 |
| 6,917,088 B2 * | 7/2005 | Takahashi et al. | 257/422 |
| 7,218,103 B2 * | 5/2007 | Kobayashi et al. | 324/252 |
| 7,342,396 B2 * | 3/2008 | Pannetier et al. | 324/248 |
| 7,352,184 B2 * | 4/2008 | Komuro et al. | 324/319 |
| 7,466,126 B2 * | 12/2008 | Kliman et al. | 324/219 |
| 7,683,612 B2 * | 3/2010 | Koyama | 324/249 |
| 7,705,586 B2 | 4/2010 | van Zon et al. | |
| 2004/0130323 A1 * | 7/2004 | Oohashi et al. | 324/252 |
| 2004/0150397 A1 * | 8/2004 | Kuroe et al. | 324/249 |
| 2004/0174164 A1 * | 9/2004 | Ao | 324/252 |
| 2004/0239320 A1 * | 12/2004 | Kobayashi et al. | 324/249 |
| 2004/0245864 A1 * | 12/2004 | Bailey | 310/15 |
| 2005/0122101 A1 * | 6/2005 | Bohlinger et al. | 324/252 |
| 2006/0067008 A1 | 3/2006 | Haratani | |
| 2006/0238191 A1 * | 10/2006 | Saito | 324/252 |
| 2008/0116885 A1 * | 5/2008 | Van Zon et al. | 324/207.21 |
| 2008/0238420 A1 * | 10/2008 | Haratani et al. | 324/252 |
| 2009/0073608 A1 * | 3/2009 | Ookawa et al. | 360/125.03 |

FOREIGN PATENT DOCUMENTS

| | | | | |
|---|---|---|---|---|
| CN | 101065721 A | 10/2007 | | |
| EP | 1 640 992 A2 | 3/2006 | | |
| JP | 8-279112 A | 10/1996 | | |
| JP | 11-274599 | 10/1999 | | |
| JP | 2000-516714 A | 12/2000 | | |
| JP | 2000-516714 T | 12/2000 | | |
| JP | 2001-331913 A | 11/2001 | | |
| JP | 2002100010 A | * 4/2002 | | G11B 5/39 |
| JP | 2004-354181 A | 12/2004 | | |
| JP | 2006-100424 A | 4/2006 | | |
| JP | 2006-156661 A | 6/2006 | | |
| WO | 98/07165 A2 | 2/1998 | | |
| WO | 2006/057379 A1 | 6/2006 | | |
| WO | 2008/111336 A1 | 9/2008 | | |

OTHER PUBLICATIONS

International Search Report w/translation from PCT/JP2009/066948 dated Jan. 12, 2010 (4 pages).
Espacenet Abstract Publication No. JP2001331913A dated Nov. 30, 2001 (1 page).
Espacenet Abstract Publication No. JP2006100424A dated Apr. 13, 2006 (1 page).
Espacenet Abstract Publication No. JP2004354181A dated Dec. 16, 2004 (1 page).
Espacenet Abstract Publication No. JP2006156661A dated Jun. 15, 2006 (1 page).
Espacenet Abstract Publication No. JP2000516714T dated Dec. 12, 2000 (1 page).
Espacenet Abstract Publication No. JP8279112A dated Oct. 22, 1996 (1 page).
Notification of Transmittal of the International Preliminary Report and Written Opinion for International Application No. PCT/JP2009/066948 mailed May 19, 2011 (6 pages).
Extended European Search Report issued in Application No. 09816285.2, mailed on Mar. 14, 2014 (8 pages).
Guedes A., et al.; "Improving Magnetic Field Detection Limits of Spin Valve Sensors Using Magnetic Flux Guide Concentrators:" IEEE Transactions on Magnetics; vol. 43, No. 6; Jun. 1, 2007; pp. 2376-2378 (3 pages).

* cited by examiner

SIGNAL TRANSMISSION DEVICE

BACKGROUND OF THE INVENTION

1. Field of the Invention

One or more embodiments of the present invention relate to a magnetic detection element for detecting a magnetic field intensity and a signal transmission device for transmitting a signal by means of a magnetic coupling.

2. Description of the Related Art

Patent literature 1, for instance, discloses a magnetic coupling type of signal transmission device comprising a coil which generates a magnetic field in accordance with a input signal and a bridge circuit which includes a magnetoresistance effect element (magnetic detection element) to detect the intensity of the magnetic field generated by the coil.

Patent literature 2, for instance, discloses a granular in gap (GIG) configuration in which a pair of yoke films consisting of a soft magnetic material is arranged to guide a large amount of magnetic flux into both side of the granular film exhibiting a giant magnetoresistance effect (generically electric resistance of a material varies by amount more than few % with an external magnetic field), in order to enhance a variation sensitivity of the electric resistance of the granular film exhibiting a giant magnetoresistance effect.

In such GIG configuration, when external magnetic field is inputted, first the yoke consisting of a soft magnetic material having a large magnetic flux density is magnetized, the magnetic flux generated by the large magnetization passes through the granular film exhibiting a giant magnetoresistance effect to achieve large amount of variation in the electric resistance with a small variation of the external magnetic field. However, in the GIG configuration, a linear range where magnetic field intensity can be linearly detected is limited in a significantly narrow range, because of a nonlinear magnetic flux increasing characteristic according to a magnetizing procedure of the soft magnetic material yoke film and to a nonlinear resistance variation characteristic in the magnetoresistance effect of the granular film.

Patent literature 3, for instance, discloses a technique for detecting a very small variation of magnetic flux by providing a magnetic path with a bypass to reduce magnetic flux applied to the detecting coil. In this technique, the magnetic flux variation detection range is widened by reducing the sensitivity, but the range having high linearity in electric resistance can not be widened, and therefore the linearity of the magnetoresistance effect element can not be improved.

PATENT LITERATURES

[Patent literature 1] JP 2000-516714 A
[Patent literature 2] JP 2004-354181 A
[Patent literature 3] JP H08-279112 A

SUMMARY OF THE INVENTION

One or more embodiments of the present invention may provide a magnetic detection element with a high linearity and a signal transmission device with a high linearity.

A magnetic detection element according to one or more embodiments of the present invention has a magnetoresistance effect portion composed of a magnetoresistance effect material, a pair of yoke portions which is composed of a soft magnetic material and respectively arranged so as to be electrically connected to both sides of the magnetoresistance effect portion, and which guides magnetic flux into the magnetoresistance effect portion, and a bypass portion which is composed of a soft magnetic material and saturated with magnetic flux at lower magnetic field intensity than the yoke portions, and which guides a part of the magnetic flux generated in the yoke portions so as to divert the magnetic flux from the magnetoresistance effect portion.

With this configuration, in a condition that the bypass portion is not yet saturated with a low external magnetic field intensity, a portion of magnetic flux generated in the yoke portion with the external magnetic field passes through the bypass portion to reduce a magnetic flux passing thorough the magnetoresistance effect portion. In contrast, with an increased external magnetic field, the bypass portion is saturated before the yoke portions, and therefore all of increase in magnetic flux generated in the yoke portions passes thorough the magnetoresistance effect portion. As a result, electric resistance variation profile of the magnetoresistance effect portion varies so as to enhance the linearity.

Further, in the magnetic detection element according to one or more embodiments of the present invention, the bypass portion may be electrically isolated from the magnetoresistance effect portion and the yoke portions.

With this configuration, because the bypass portion is electrically isolated, the electric resistance of the magnetoresistance effect portion is accurately detected. Therefore, the influence of the bypass portion to the detection accuracy can be reduced as much as possible to enhance the linearity of variance of the electric resistance of the magnetoresistance effect portion to the magnetic field intensity.

Further, in the magnetic detection element according to one or more embodiments of the present invention, the magnetoresistance effect portion and the yoke portions may be formed in film like forms on a same plane, and the bypass portion may be formed in a film like form so as to lap at least partially over the magnetoresistance effect portion and to be spaced from the yoke portions.

With this configuration, the magnetic detection element can be produced by a common semiconductor manufacturing method in which thin film material layers are stacked on a substrate by a microfabrication technology.

Further, in the magnetic detection element according to one or more embodiments of the present invention, a reluctance of a magnetic path diverted from the magnetoresistance effect portion via the bypass portion may be smaller than a reluctance of the magnetoresistance effect portion between the yoke portions at a magnetic field intensity which does not saturate the bypass portion with magnetic flux.

With this configuration, more flux is diverted from the magnetoresistance effect portion at a low magnetic field intensity, and therefore the bypass portion has large effect to the resistance variation characteristic so as to significantly improve the linearity of the resistance variation characteristic.

Further, in the magnetic detection element according to one or more embodiments of the present invention, the bypass portion may be partially saturated with magnetic flux at different magnetic field intensities.

With this configuration, by each saturation of the parts of the bypass portion, a ratio of bypassing flux is varied so as to cause the resistance variation characteristic of the magnetoresistance effect portion to be more linier with respect to the external magnetic field.

Further, in the magnetic detection element according to one or more embodiments of the present invention, the bypass portion may comprise portions with different lengths in a direction of guiding magnetic flux.

With this configuration, by a planer shape of the bypass portion, the magnetic field intensity saturating the bypass portion with magnetic flux can be partially differed.

Furthermore, a signal transmission device according to one or more embodiments of the present invention has any one of the aforesaid magnetic detection element, and a coil which applies a magnetic field to the magnetic detection element in accordance with an input signal.

With this configuration, it has a high transmission efficiency and an input-output transmission with better linearity can be made by one or more embodiments of the present invention. Accordingly, a high quality signal transmission can be achieved.

In accordance with one or more embodiments of the present invention, in a condition that the bypass portion is not yet saturated with a low external magnetic field intensity, a part of magnetic flux generated in the yoke portion with the external magnetic field passes through the bypass portion to reduce a magnetic flux passing thorough the magnetoresistance effect portion. In contrast, with an increased external magnetic field, the bypass portion is saturated before the yoke portions, and therefore all of increase in magnetic flux generated in the yoke portions passes thorough the magnetoresistance effect portion. As a result, electric resistance variation profile of the magnetoresistance effect portion varies so as to enhance the linearity.

DETAILED DESCRIPTION

Figure 1:
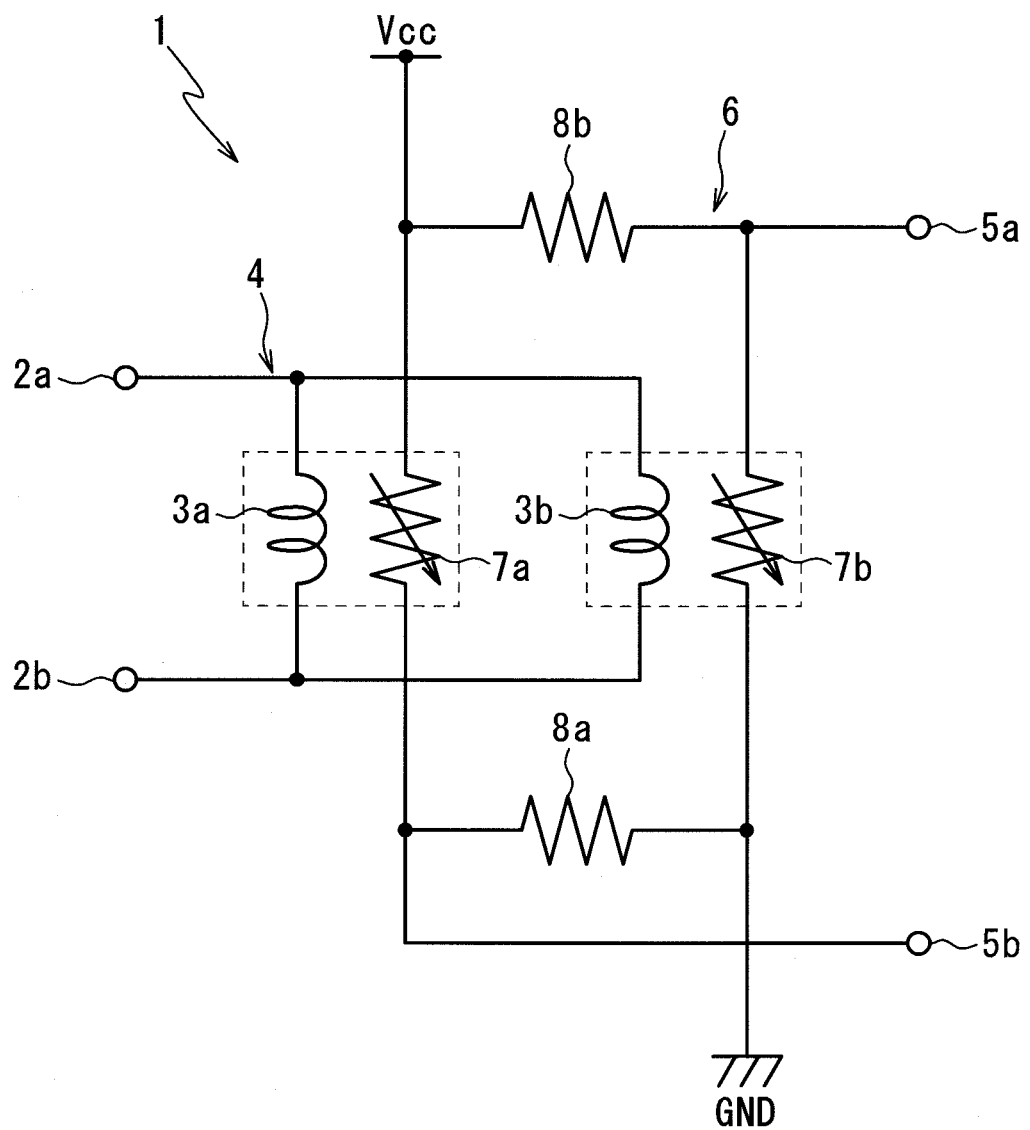
FIG. 1 is an electric circuit diagram of the signal transmission device as first embodiment of the present invention.

Hereinafter, embodiments of the present invention will be described with reference to the drawings. In embodiments of the invention, numerous specific details are set forth in order to provide a more thorough understanding of the invention. However, it will be apparent to one with ordinary skill in the art that the invention may be practiced without these specific details. In other instances, well-known features have not been described in detail to avoid obscuring the invention. FIG. 1 shows a circuit configuration of a signal transmission device (magnetic coupling type isolator) 1 as first embodiment of the present invention. The signal transmission device 1 comprises a primary circuit 4 having two excitation coils $3a$, $3b$ which generate magnetic fields according to currents inputted to input terminals $2a$, $2b$, and a secondary circuit 6 which is magnetically coupled with the primary circuit 4 and outputs an electric voltage to output terminals $5a$, $5b$ in accordance with the input voltage.

The secondary circuit 6 is a bridge circuit that comprises two magnetic detection elements $7a$, $7b$ of which electric resistance value varies according to the intensity of the magnetic field generated by the exciting coils $3a$, $3b$, and two fixed resistances $8a$, $8b$ of which resistance value is unchangeable, and that is connected to a power source Vcc.

Figure 2:
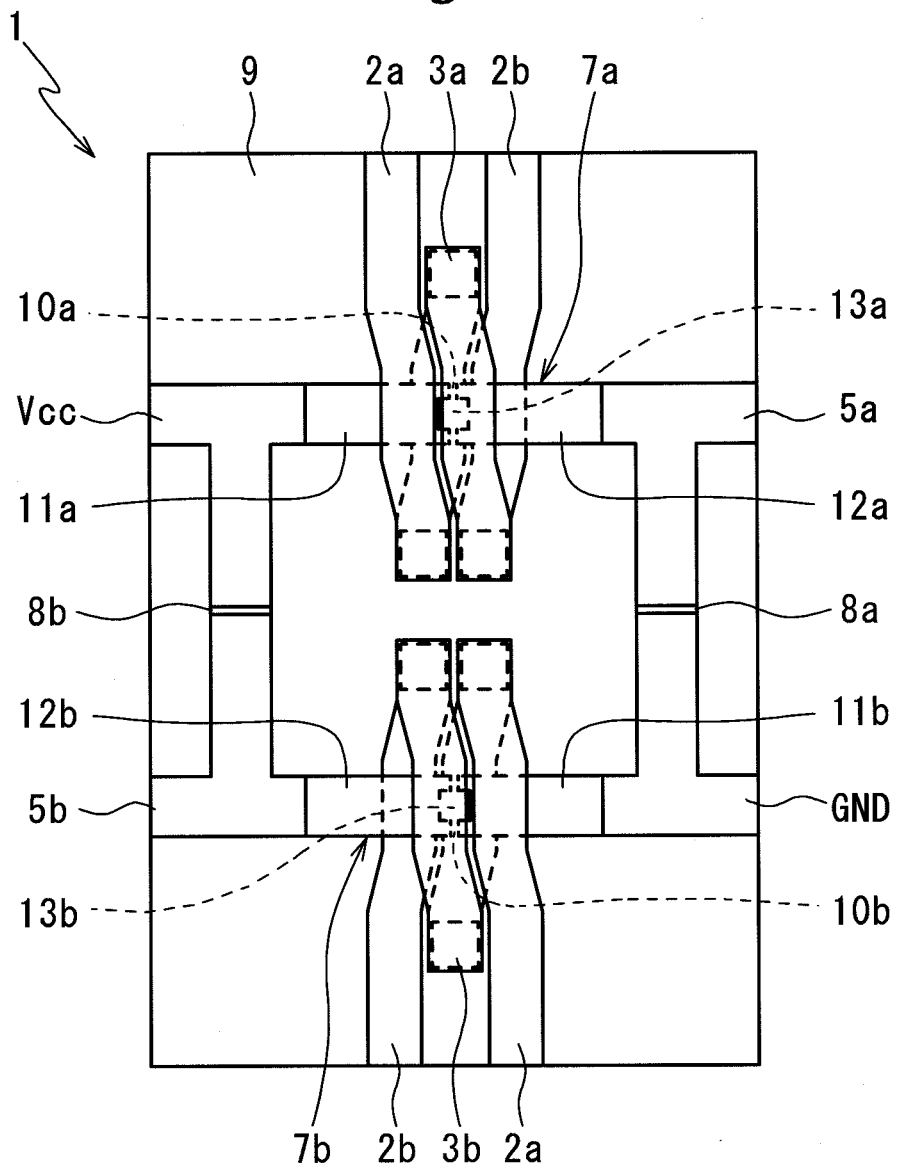
FIG. 2 is a plane view of the signal transmission device in FIG. 1.

FIG. 2 shows a practical configuration of the signal transmission device 1 (in plane view). The signal transmission device 1 is configured by layer stacking of each component on a silicon substrate 9 on which surface insulation film is formed. The exciting coils $3a$, $3b$ are respectively formed so as to surround the magnetic detection elements $7a$, $7b$.

Figure 3:
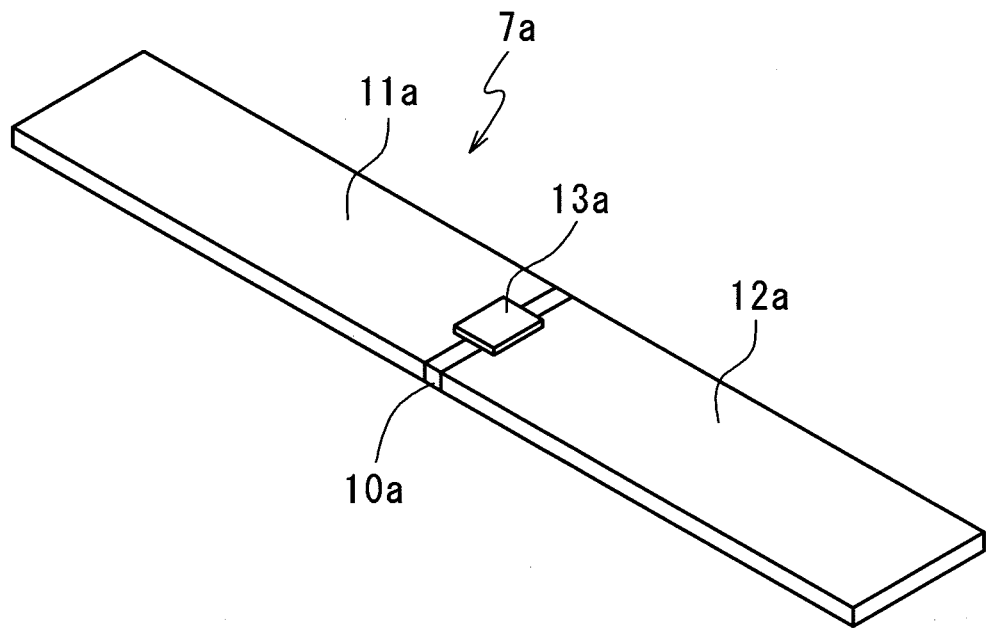
FIG. 3 is a perspective view of the magnetic detection element in FIG. 2.
Figure 4:
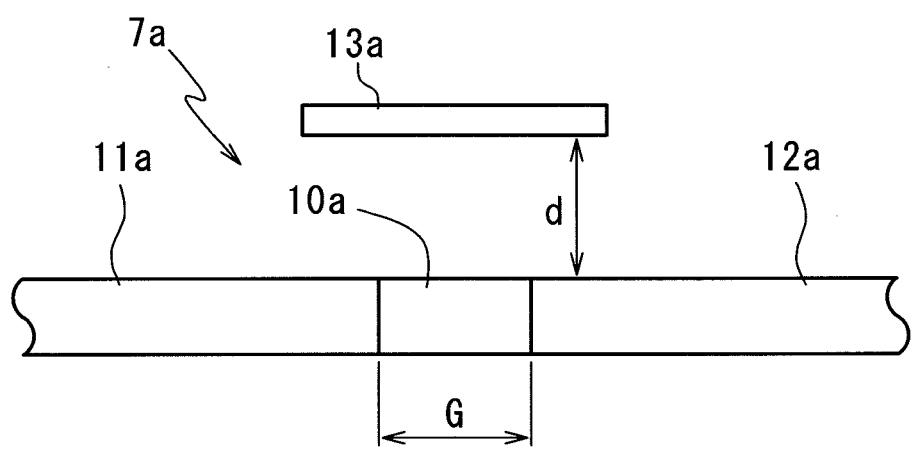
FIG. 4 is a plane view of the magnetic detection element in FIG. 3.

The magnetic detection elements $7a$, $7b$ comprise, as further shown in FIG. 3 (perspective view) and FIG. 4 (sectional view) specifically, of magnetoresistance effect portions (called as MR portions bellow) $10a$, $10b$ composed of a giant magnetoresistance effect material and yoke portions $11a$, $12a$ and $11b$, $12b$ which is composed of a soft magnetic material and which is arranged at both sides of the MR portions $10a$, $10b$ so as to maintain respective contacts with the MR portions $10a$, $10b$. These yoke portions have significantly lower specific resistances than the above giant magnetoresistance effect material to function also as electrodes to supply current to the MR portions $10a$, $10b$ (so called GIG). Further, the magnetic detection elements $7a$, $7b$ have bypass portions $13a$, $13b$ which is composed of a soft magnetic material and which is arranged so as to lap over the MR portions $10a$, $10b$ and to form a gap d between with yoke portions $11a$, $12a$ and $11b$, $12b$ for electric isolation.

The gap d between the bypass portions $13a$, $13b$ and the MR portions $10a$, $10b$, also and the yoke portions $11a$, $12a$, $11b$, $12b$ can be a air layer, but practically is an insulation film (protection film) made of nonmagnetic material and formed between the bypass portions $13a$, $13b$ and the MR portions $10a$, $10b$, also and the yoke portions $11a$, $12a$, $11b$, $12b$.

As giant magnetoresistance effect materials for forming the MR portions 10a, 10b, cited are nano-granular film materials, for instance, $Co_{39}Y_{14}O_{47}$, $Co_{43}Y_{24}O_{33}$ and $Co_{35}Mg_{20}F_{45}$ having specific resistances typically of $3\times10^6$ μΩm, $0.4\times10^3$ μΩm and $1\times10^6$ μΩm respectively. In addition, as giant magnetoresistance effect materials, $Co_x$—$(Y_2O_3)_{(100-X)}$ nano-granular alloys, $Co_x$—$(Al_2O_3)_{(100-X)}$ nano-granular alloys, $Co_x$—$(Sm_2O_3)_{(100-X)}$ nano-granular alloys, $Co_x$—$(Dy_2O_3)_{(100-X)}$ nano-granular alloys, $(FeCO)_x$—$(Y_2O_3)_{(100-X)}$ nano-granular alloys, fluoride nano-granular alloys such as $Fe_x$—$(Mg_2F_2)_{(100-X)}$, $(FeCO)_x$—$(Mg_2F_2)_{(100-X)}$ can be used. Notably, composition ratios are indicated in at % in the present application.

As soft magnetic materials for forming the yoke portions 11a, 12a, 11b, 12b and the bypass portions 13a, 13b are, for instance, $Co_{77}Fe_5SiB_8$ and $Fe_{78.5}Ni_{21.5}$ having specific resistances typically of 1.15 μΩm, 00.06 μΩm respectively. In addition, as soft magnetic materials, permally (40-90% Ni—Fe alloy), Cemendust ($Fe_{74}Si_9Al_{17}$), hard permally ($Fe_{12}Ni_{82}Nb_6$), $Co_{88}Nb_6Zr_G$ amorphous alloy, $(Co_{88}Fe_6)_{70}Si_{15}B_{15}$ amorphous alloy, Finemet ($Fe_{75.8}Si_{13.2}Nb_{1.9}Cu_{0.8}$), Nanomax ($Fe_{83}HF_6C_{11}$), $Fe_{85}Zr_{10}B_5$ alloy, $Fe_{93}Si_3N_4$ alloy, $Fe_{71}B_{11}N_{18}$ alloy, $Fe_{71.3}Nd_{9.6}O_{19.1}$ nano-granular alloy, $Co_{70}Al_{10}O_{20}$ nano-granular alloy, $Co_{65}Fe_5Al_{10}O_{20}$ alloy can be used. Further, as materials for forming the gap d, inorganic materials for instance, $SiO_2$ and $Al_2O_3$ are cited.

The yoke portions 11a, 12a and 11b, 12b are formed in film forms on a same plane in a rectangular shape, for instance, with a length of 250 μm in a longitudinal direction (the direction of magnetic flux), a width of 80 μm and a thickness of 0.5 μm, so that end portions of each pair oppose to each other with a gap G respectively. The MR portions 10a, 10b are formed so as to be electrically connected with the yoke portions 11a, 12a and 11b, 12b within the gap G.

The bypass portions 13a, 13b has for instance a length of 5 μm, a width of 5μ and a thickness of 0.1 μm, and is formed with 0.1 μm of gap d between with the MR portions 10a, 10b and the yoke portions 11a, 12a and 11b, 12b.

Figure 5:
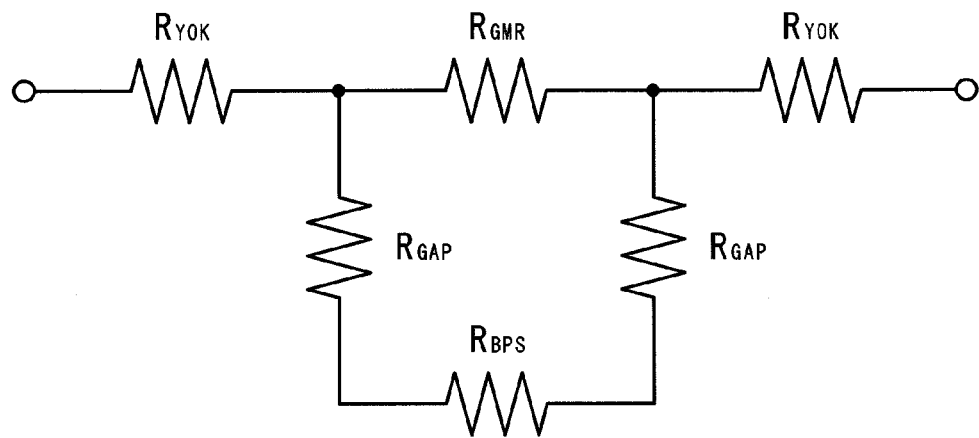
FIG. 5 is a reluctance diagram of the magnetic circuit of the magnetic detection element in FIG. 3.

FIG. 5 shows a configuration of the magnetic detection elements 7a, 7b in magnetic path reluctance (magnetic circuit diagram). This magnetic path reluctance can be considered as one in which a reluctance consisting of a reluctance $R_{GAP}$ of the air or nonmagnetic insulating portion between the yoke portions 11a, 11b and the bypass portions 13a, 13b, a reluctance $R_{BPS}$ of the bypass portions 13a, 13b, and reluctance $R_{GAP}$ of the air or nonmagnetic insulating portion between the bypass portions 13a, 13b and the yoke portions 12a, 12b connected in series is further connected in parallel with a reluctance $R_{GMR}$ of the MR portions 10a, 10b, between reluctances $R_{YOK}$ of the yoke portions 11a, 11b and the yoke portions 12a, 12b.

Therefore, in the magnetic detection elements 7a, 7b, magnetic flux generated by the exciting coils 3a, 3b and guided by the yoke portions 11a, 12a, 11b, 12b is at first divided into the bypass portions 13a, 13b and the yoke portions 11a, 12a, 11b, 12b. This meaning that the bypass portions 13a, 13b attract a part of the number of magnetic flux generated in the yoke portions 11a, 12a, 11b, 12b to divert from the MR portions 10a, 10b and thereby reduce the amount of the magnetic flux passing thorough the MR portions 10a, 10b.

Notably, the reluctance $R_{YOK}$, $R_{GMR}$, $R_{BPS}$ respectively vary in its value according to the magnetic field intensity. Generally, a reluctance value increases with increasing of amount of passing magnetic flux according to a rising of magnetic field intensity. And, because saturation with magnetic flux is caused at certain magnetic field intensity, the reluctance value comes to increase in a significantly higher rate compared to at low magnetic field intensity, and the reluctance value stops increasing any further amount of magnetic flux passing thorough when saturation is completed. Specifically, the reluctances $R_{GMR}$ of the bypass portions 13a, 13b rapidly increase at lower magnetic field than other reluctances.

It is noted that the reluctance $R_{GMR}$ can be described as bellow expression, wherein the $G_{GMR}$ represents the length of the MR portions 10a, 10b in the direction where the magnetic flux is applied (magnetic path length), $\mu_{GMR}$ represents the magnetic permeability of the MR portions 10a, 10b, $t_{GMR}$ represents the thickness of the MR portions 10a, 10b and $W_{GMR}$ represents the width of the MR portions 10a, 10b (magnetic path width).

$$R_{GMR}=G_{GMR}/(\mu_{GMR}\times t_{GMR}\times W_{GMR})$$

Figure 6:
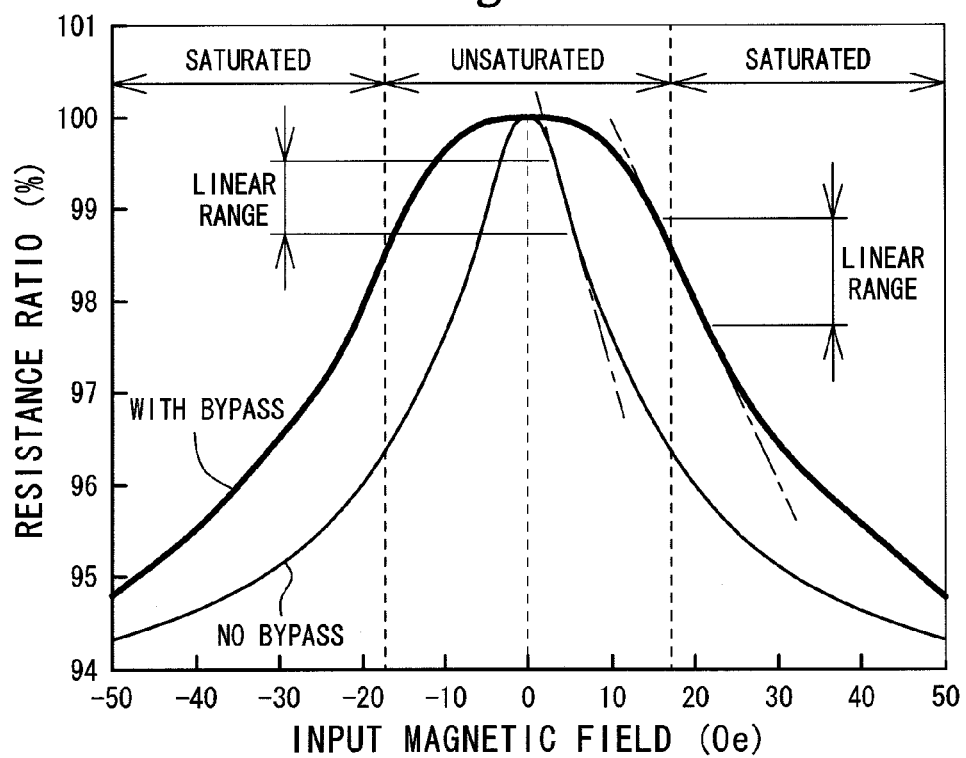
FIG. 6 is a chart showing variation of electric resistance of the magnetic detection element in FIG. 3 with respect to magnetic field intensity.

FIG. 6 shows a result of a simulation of variation of the electric resistance between the yoke portions 11a, 11b and the yoke portions 12a, 12b including the MR portions 10a, 10b with respect to the input magnetic field intensity applied to the magnetic detection elements 7a, 7b, in MR ratio in which the resistance at zero of magnetic field intensity is 100%. Notably, the result is illustrated in comparison to an electric resistance of a magnetic detection element with conventional configuration without the bypass portion 13a, 13b. Remarkably, the bypass portion 13a, 13b is electrically insulated from the MR portions 10a, 10b and the yoke portions 11a, 11b, 12a, 12b, and therefore does not influent the electric resistance of the electrical path including the MR portions 10a, 10b.

In this simulation, used are a nano-granular film composed of $(FeCo)_{30}$—$(MgF_2)_{70}$ with 14% of MR ratio at 10 Oe as the MR portion 10 and amorphous $Co_{78}Fe_4Si_9B_9$ films which have 12 KG of magnetic flux density at 10 Oe and single axis induced magnetic anisotropy, and of which magnetic permeability varies almost linearly form the zero magnetic field to the saturated magnetic field, as the yoke portions 11, 12. And an amorphous film composed of the same material with the yoke portions 11, 12 is used as the bypass portion 13.

The MR portions 10a, 10b decrease its electric resistance with increasing of passing magnetic flux. However when the bypass portions 13a, 13b are not yet saturated, parts of the magnetic flux generated in the yoke portions 11a, 11b, 12a, 12b are induced into the bypass portions 13a, 13b, and therefore the electric resistance reducing rate of the MR portions 10a, 10b is lower than that in a conventional element. In the Figs. the variation characteristics of the MR ratio (shape of the diagram) are expanded in the lateral direction with reference to that of the conventional one.

However, because the sectional areas (thickness×width) of the bypass portions 13a, 13b are sufficiently smaller than the sectional areas (thickness×width) of the yoke portions 11a, 11b, 12a, 12b, the input magnetic field comes to strong. Therefore, when the amount of the magnetic flux generated by the exciting coils 3a, 3b increases (the intensity of the magnetic field which is generated by the exciting coils 3a, 3b and applied to the magnetic detection elements 7a, 7b is increased), the bypass portions 13a, 13b are saturated with magnetic flux so as to be impossible to guide any more magnetic flux. Accordingly, when the intensity of the input magnetic field is high, the magnetic flux bypassing function of the bypass portions 13a, 13b is low, and therefore most increase of magnetic flux generated in the yoke portions 11a, 11b, 12a, 12b are guided into the MR portions 10a, 10b. In the diagram, with reaching to saturation of the bypass portions 13a, 13b, the degree of lateral expansion of the curve with reference to the conventional curve get smaller. Accordingly the linearity of the MR ratio variation characteristic is enhanced.

In the magnetic detection elements 7a, 7b, when the intensity of the input magnetic field is further increased, the bypass portions 13a, 13b are completely saturated before the yoke portions 11a, 11b, 12a, 12b. As a result, all increase of magnetic flux generated in the yoke portions 11a, 11b, 12a, 12b passes through the MR portions 10a, 10b, after the bypass portions 13a, 13b are completely saturated. According to this function, the decrease of the electric resistance varying rate due to increasing of the reluctances of the MR portions 10a, 10b and the yoke portions 11a, 11b, 12a, 12b is compensated, so as to obtain a variation characteristic of the electric resistance (MR ratio) with higher linearity. This means that magnetic detection elements 7a, 7b provided with the bypass portions 13a, 13b has a wider range where the linearly is excellent in the variation characteristic of the electric resistance (MR ratio) with respect to the variation of the input magnetic field, compared to conventional magnetic detection elements.

Because when the ratio of magnetic flux which is guided by the bypass portions 13a, 13b so as to be diverted from the MR portions 10a, 10b, to whole magnetic flux generated in the yoke portions 11a, 11b, 12a, 12b is low, the room for changing the MR ratio characteristic of the MR portions 10a, 10b is small. Therefore, when the magnetic field intensity is low, between the yoke portions 11a and 12b and between the yoke portions 11b and 11b, the reluctances of magnetic paths via the bypass portions 13a, 13b ($2R_{YOK}+2R_{GAP}+R_{BPS}$) are preferably smaller than the reluctances of magnetic paths via the MR portions 10a, 10b ($2R_{YOK}+R_{GMR}$).

In a case that the reluctances of magnetic paths via the bypass portions 13a, 13b ($2R_{YOK}+2R_{GAP}+R_{BPS}$) is excessively smaller than the reluctances of magnetic paths via the MR portions 10a, 10b ($2R_{YOK}+R_{GMR}$), too much magnetic flux is guided into the bypass portions 10a, 10b, and therefore, in FIG. 6, the line profile of the MR ratio variation characteristic with the bypass portions 13a, 13b is too expanded laterally. Accordingly, the varying rate of the electric resistance of the MR portions 10a, 10b with respect to the input magnetic field is law, and hence the sensitivity of detection of magnetic field is reduced. In contrast, in a case that the reluctances of magnetic paths via the bypass portions 13a, 13b are excessively large, magnetic flux can not be guided into the bypass portions 10a, 10b, and therefore the function to divert the magnetic flux from the MR portions 10a, 10b has almost disappeared. Accordingly, the function to improve the electric resistance variation characteristic is not obtained. As the above, the balance between the reluctances of magnetic paths via the bypass portions 13a, 13b ($2R_{YOK}+2R_{GAP}+R_{BPS}$) and the reluctances of magnetic paths via the MR portions 10a, 10b ($2R_{YOK}+R_{GMR}$) should be considered.

Figure 7:
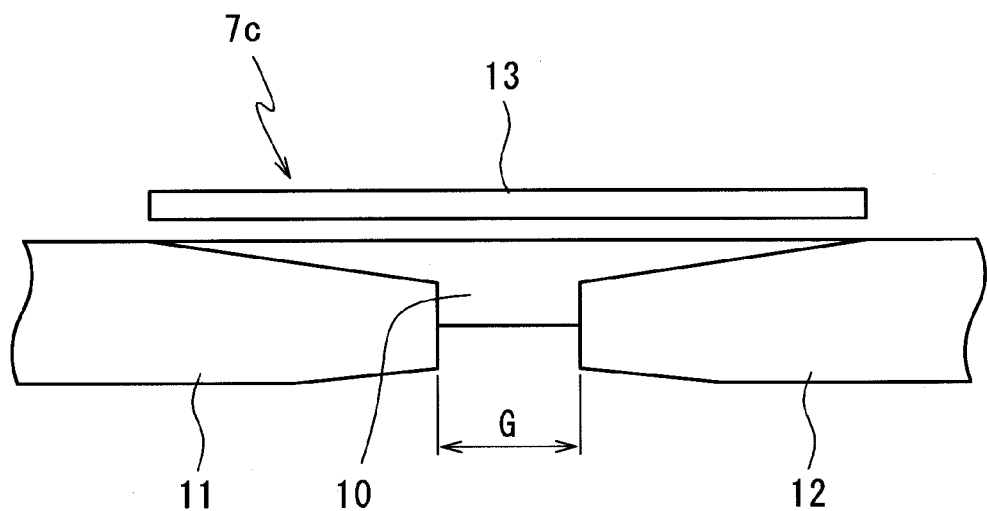
FIG. 7 is a side view of a magnetic detection element as second embodiment of the present invention.
Figure 8:
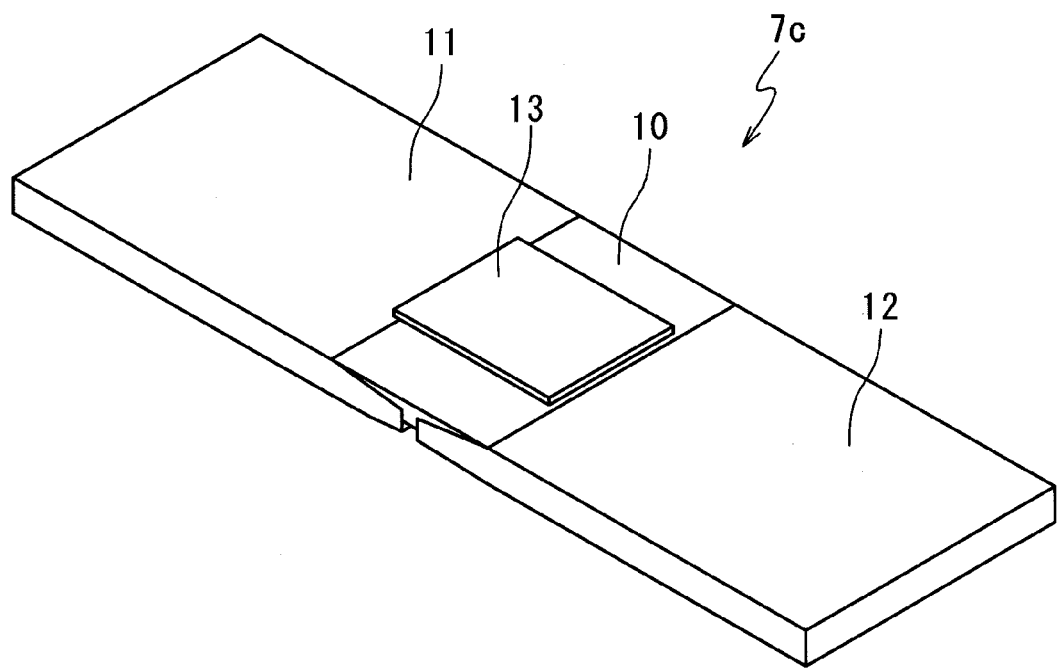
FIG. 8 is a perspective view of the magnetic detection element in FIG. 7.

FIG. 7 and FIG. 8 show a magnetic detection element 7c as second embodiment of the present invention. The magnetic detection element 7c of the second embodiment comprises yoke portions 11, 12 of which end facing to each other with a gap G is reduced in thickness in a tapered shape, a MR portion 10 formed by filling magnetoresistance effect material into a region from tapered portion on one side of the yoke portions 11, 12 to the middle of the gap G, and a bypass portion 13 formed so as to lap over the MR portion 10 with interposition of unshown isolation film.

The yoke portions 11, 12 have a length of 50 μm in a direction where the magnetic flux is guided (a direction to sandwich the MR portion 10), a width of 80 μm and a thickness of 0.5 μm, and face to each other so as to form a gap G. And, the yoke portions 11, 12 have a face respectively inclined in a tapered shape for a length of 2 μm from the end face of the MR portion 10 in the guiding direction for magnetic flux, on the bypass portion 13 side, and 2 μm of thickness defining the gap G. Bypass portion has a length of 5 μm in the guiding direction for magnetic flux that is as same as the whole length of the MR portion including a part covering the tapered portion of the yoke portions 11, 12. The gap d between the MR portion 10 and the bypass portion 13 (thickness of a isolation film made of a spatter $SiO_2$ film) is 0.05 μm.

In this magnetic detection element 7c, as the MR portion 10, a nano-granular film with 0.3 μm of film thickness in the gap G made of $(FeCO)_{30}$—$(Mg_2F_2)_{70}$ with 14% of MR ratio at 10 Oe is used, as the yoke portions 11, 12, amorphous $Co_{78}Fe_4Si_9B_9$ films which have 12 KG of magnetic flux density at 10 Oe and single axis induced magnetic anisotropy, and of which magnetic permeability varies almost linearly form the zero magnetic field to the saturating magnetic field. And, as the bypass portion 13, an amorphous film of the same material with the yoke portions 11, 12 is used.

Figure 9:
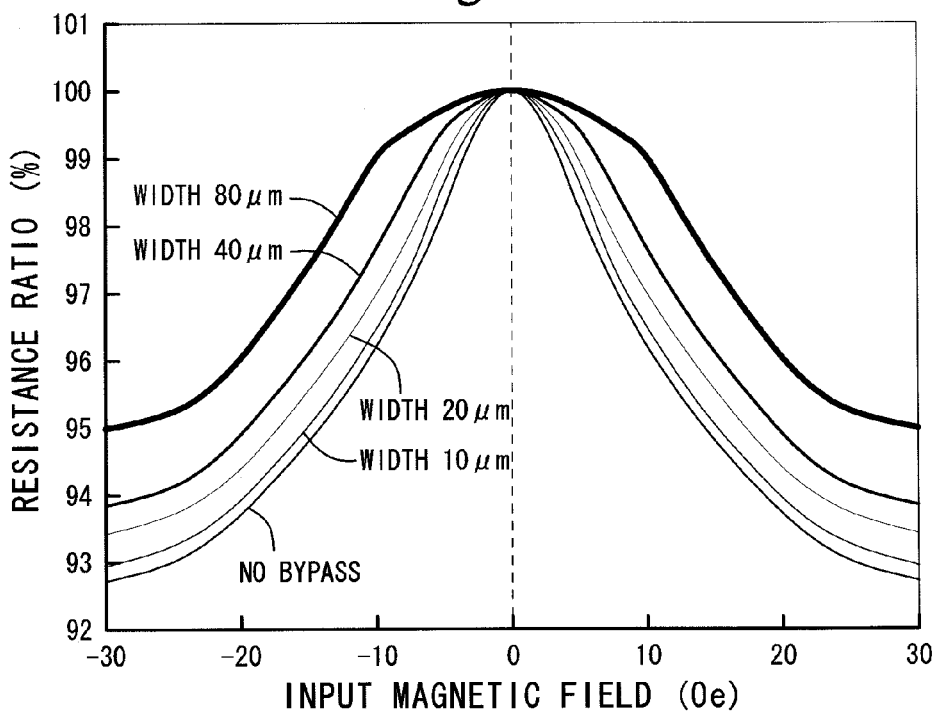
FIG. 9 is a chart showing variation of electric resistance of the magnetic detection element in FIG. 7 with different widths of the bypass portion, with respect to magnetic field intensity.

FIG. 9 shows measured results of variations of electric resistances (MR ratios) between the yoke portion 11 and the yoke portion 12 including the MR portion 10 with respect to the intensity of the input magnetic field, with the magnetic detection elements 7c of the present embodiment having thickness of the bypass portion 13 of 0.2 μm and respectively the widths of the bypass portion 13 of 80 μm as same as the yoke portions 11, 12, of 40 μm as half of the yoke portions 11, 12, of 20 μm as quarter of the yoke portions 11, 12, and of 10 μm as one eighth of the yoke portions 11, 12.

As shown in the diagram, in the magnetic detection element 7c, in the range with input magnetic field lower than 10 (Oe), the curves of the MR ratios expanded in the horizontal axis direction by the bypass portion similar to the first embodiment, and after the bypass portion 13 has been fully saturated with stronger input magnetic field, drawn curves generally coincide the parallel translated curves of the conventional magnetic detection elements without a bypass portion. Further, in this embodiment, the yoke portions 11, 12 are also saturated at about 20 (Oe) of the magnetic field intensity. Therefore, at higher magnetic field intensity, the decreasing rates of the MR ratios are significantly lowered.

With a wider width of the bypass portion 13, the amount of the magnetic flux diverted from the MR portion 10 is increased, the behavior is nonlinearly changed significantly with respect to the increasing of the amount of the magnetic flux. Therefore, the effect of enhancing the linearity around an intensity of input magnetic field where the bypass portion 13 is saturated get grater, accordingly the range where the MR ratio is linear is widened. At the same time, because with wider width of the bypass portion 13, the amount of the magnetic flux diverted from the MR portion 10 is increased, the varying rate of the MR ratio with respect to the variation of the input magnetic field is decreased. It is noted that when the yoke portions 11, 12 are saturated, the linearity is impaired, and therefore the range of magnetic field intensity where the MR ratio characteristic is enhanced by the bypass portion 13 should be a lower range than the magnetic field intensity where the yoke portions 11, 12 are saturated. Consequently, in this embodiment, in the case that the linear range is widest, the linear range is from where the bypass portion 13 starts to be saturated to where the yoke portions 11, 12 start to be saturated.

Figure 10:
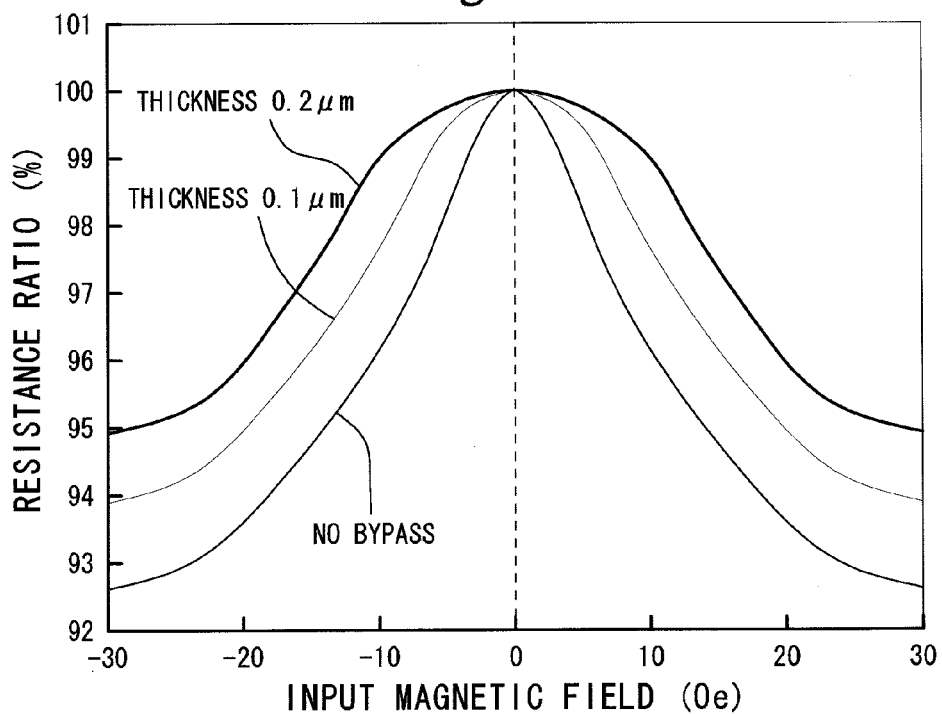
FIG. 10 is a chart showing variation of electric resistance of the magnetic detection element in FIG. 7 with different thicknesses of the bypass portion, with respect to magnetic field intensity.

FIG. 10 shows measured results of variations of electric resistances (MR ratios) between the yoke portion 11 and the yoke portion 12 including the MR portion 10 with respect to the intensity of the input magnetic field, with the magnetic detection elements 7c of the present embodiment having a width of the bypass portion 13 of 0.2 μm and respectively the thicknesses of the bypass portion 13 of 0.2 μm, 0.1 μm, and without bypass portion 13.

As shown in the diagram, with larger thickness of the bypass portion 13, the degree of laterally expanding the curve of the MR ratio when the intensity of input the magnetic field is lower, and therefore the intensity of the magnetic field where the bypass portion 13 is saturated get higher. And the curve of the MR ratio with the bypass portion 13 having a with of 80 μm and a thickness of 0.1 μm in the FIG. 10 almost coincide to the curve with the bypass portion 13 having a with of 40 μm and a thickness of 0.2 μm in the FIG. 9. That means the MR ratio characteristic is generally same as far as the cross sectional area of the bypass portion 13 is same in the case that the other condition is same.

Also, the saturabilities of the yoke portions 11, and the bypass portion 13 depend on the each cross sectional area. In this embodiment, because the yoke portions 11, 12 and the bypass portion 13 are made from the same material, the cross sectional area of the by pass portion 13 should be smaller than the cross sectional area of the yoke portions 11, 12. It is noted that the term "cross sectional area" here means an effective sectional area that limits the amount of passing magnetic flux through it.

Therefore, in the magnetic detection elements 7c, by choosing the ratio between the cross sectional area of the bypass portion 13 and the cross sectional area of the yoke portions 11, 12, the balance between the reluctance of the magnetic path via bypass portion 13 ($2R_{YOK}+2R_{GAP}+R_{BPS}$) and the reluctance of the magnetic path via MR portion 10 ($2R_{YOK}+R_{GMR}$) can be adjusted.

In the magnetic detection elements 7c of the present embodiment, also by changing the over lapping area of the bypass portion 13 and the yoke portions 11, 12 seen from the top, the balance between the reluctance of the magnetic path via bypass portion 13 ($2R_{YOK}+2R_{GAP}+R_{BPS}$) and the reluctance of the magnetic path via MR portion 10 ($2R_{YOK}+R_{GMR}$) can be adjusted.

Further in the present embodiment, by changing the amount of the gap d between the bypass portion 13 and the yoke portions 11, 12, the reluctance between the bypass portion 13 and the yoke portions 11, 12 $R_{GAP}$ can be varied.

While, in the present embodiment, the bypass portion 13 is arranged so as to lap over the one side of the MR portion 10, the bypass portion 13 can be in any form as far as the bypass portion 13 can guide the magnetic flux generated in the yoke portions 11, 12 to divert from the MR portion 10. For instance, the bypass portion 13 may be arranged on both or one side of the MR portion 10 (the gap G between the yoke portions 11, 12). In a case that the MR portion 10 occupies only a part of the gap G between the yoke portions 11, 12, the bypass portion 13 may be arranged in the gap G between the yoke portions 11, 12.

Figure 11:
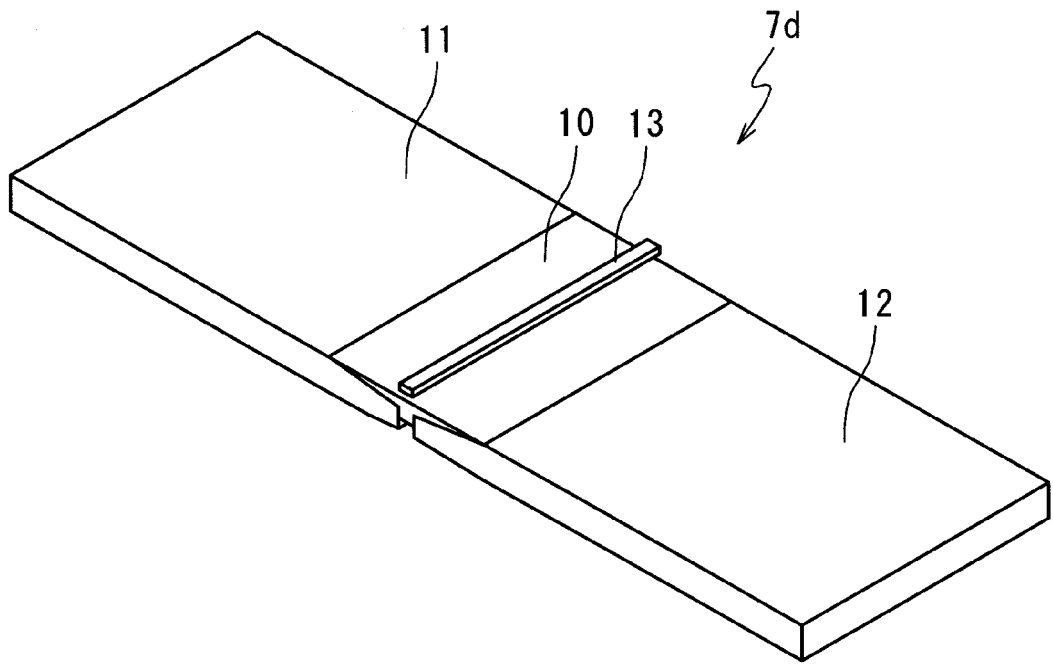
FIG. 11 is a perspective view of a magnetic detection element as third embodiment of the present invention.
Figure 12:
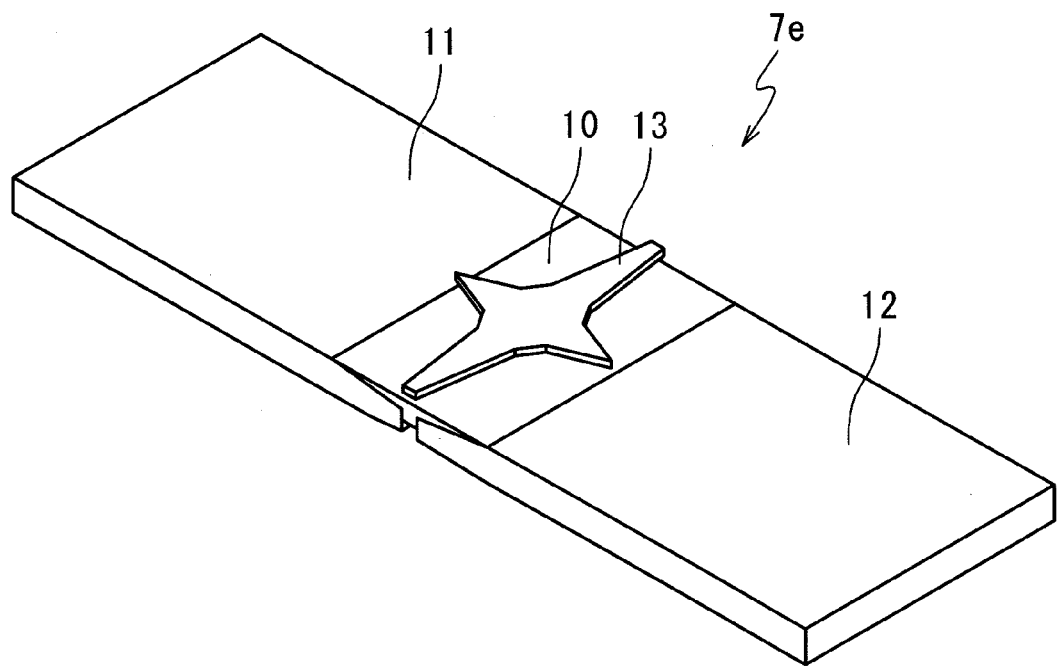
FIG. 12 is a perspective view of a magnetic detection element as fourth embodiment of the present invention.
Figure 13:
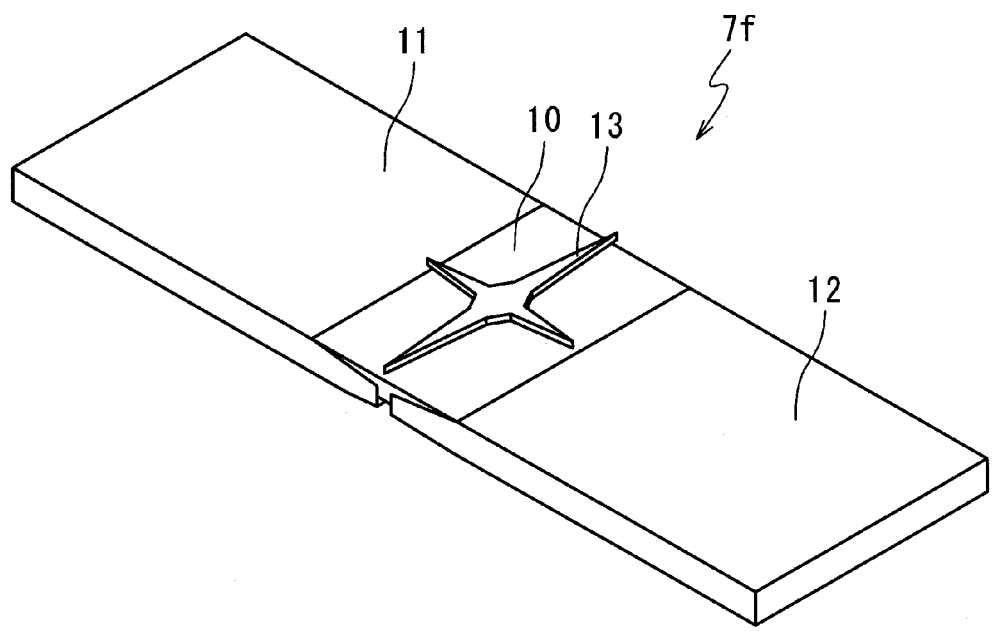
FIG. 13 is a perspective view of a magnetic detection element as fifth embodiment of the present invention.

FIG. 11 shows a magnetic detection element 7d being third embodiment of the present invention, FIG. 12 shows a magnetic detection element 7e being fourth embodiment of the present invention, and FIG. 13 shows a magnetic detection element 7f being fifth embodiment of the present invention.

The magnetic detection element 7d of the third embodiment, as shown in FIG. 11, has the same configuration with the magnetic detection element 7c of the second embodiment, excepting the bypass portion 13 is formed so as to lap over only a part of the MR portion 10 locating the gap G.

The magnetic detection element 7e of the fourth embodiment, as shown in FIG. 12, has a bypass portion 13 with a shape as defined by that the bypass portion 13 of the magnetic detection element 7d of the third embodiment is non-uniformly expanded in the longitudinal direction of the yoke portions 11, 12, that is the direction where the bypass portion 13 guides the magnetic flux. Specifically, the bypass portion 13 has a generally cross star shape of which both ends in the direction of the width (the direction perpendicular to the direction of guiding of the magnetic flux) laps over only the portion in the gap G, the length of which gets longer as at more inside in the direction of guiding of the magnetic flux the widthwise portion, particularly so that the widthwise central portion protrudes as in a triangle shape of which tip ends reaches to the position opposite to the starting positions of the taper of the yoke portions 11, 12.

The magnetic detection element 7f of the fifth embodiment, as shown in FIG. 13, has a bypass portion 13 with a star shape sharper than the bypass portion 13 of the magnetic detection element 7e of the fourth embodiment. In the bypass portion 13 of this embodiment, the both widthwise ends is sharpened to have a length of zero in the direction of guiding magnetic flux, and the projecting portion at the widthwise center has sharp shape with a small apex angle. Therefore, the length of the bypass portion 13 in the direction of guiding magnetic flux is extremely varied.

Figure 14:
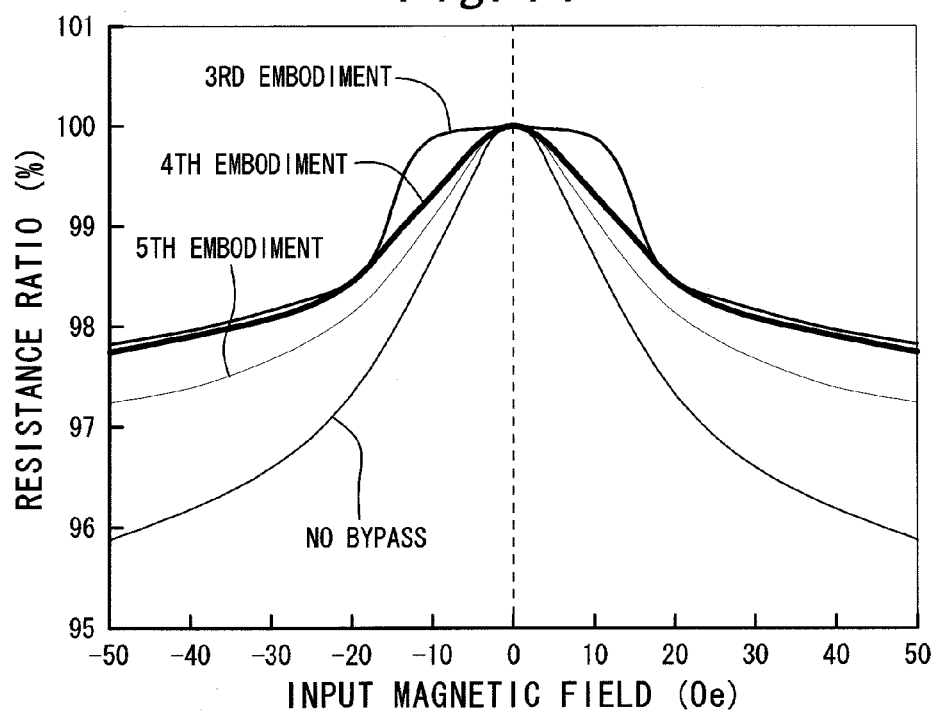
FIG. 14 is a chart showing variation of electric resistance of the magnetic detection elements in FIGS. 11-13 with respect to magnetic field intensity.

FIG. 14 shows simulation results of variation characteristics of electric resistances (MR ratio) between the yoke portion 11 and yoke portion 12 including the MR portion with respect to the intensity of the input magnetic field with the magnetic detection elements 7d, 7e, 7f and a conventional magnetic detection element consisting only of the MR portion 10 and the yoke portions 11, 12 without the bypass portion 13.

The magnetic detection element 7d of the third embodiment, similar to the magnetic detection element 7c of the second embodiment, has a low decreasing rate of MR ratio at less than about 10 (Oe) where the bypass portion begins to be saturated (the amount of the caught magnetic flux comes to increase not in proportion to the magnetic field intensity), and therefore has low linearity. In contrast, in the magnetic detection element 7e of the fourth embodiment and the magnetic detection element 7f of the fifth embodiment, the MR ratios linearly decrease in a wide range from low magnetic field intensity to about 20 (Oe) where the bypass yoke portions 11, 12 begin to be saturated, and therefore the linearity is significantly enhanced in comparison to the magnetic detection element 7d of the third embodiment.

Because the bypass portions 13 of the magnetic detection elements 7e, 7f have projecting widthwise central portions, the magnetic flux is attracted to this portions, and therefore the magnetic flux concentrates in the widthwise central portions. For this reason, widthwise central portions of the bypass portions 13 are saturated at low magnetic field intensity, earlier than the other portions. And, as the magnetic field intensity increases, the saturated area of the bypass portion 13 progressively expands from the widthwise central portion in the widthwise direction to both ends and in the longitudinal direction. Accordingly, the effect for enhancing the linearity of the MR ratio by saturation of the bypass portion is gradually produced in the widthwise direction at different timings, so as to linearly vary the MR ratio in a wide range from a low to a high magnetic field intensity.

Figure 15:
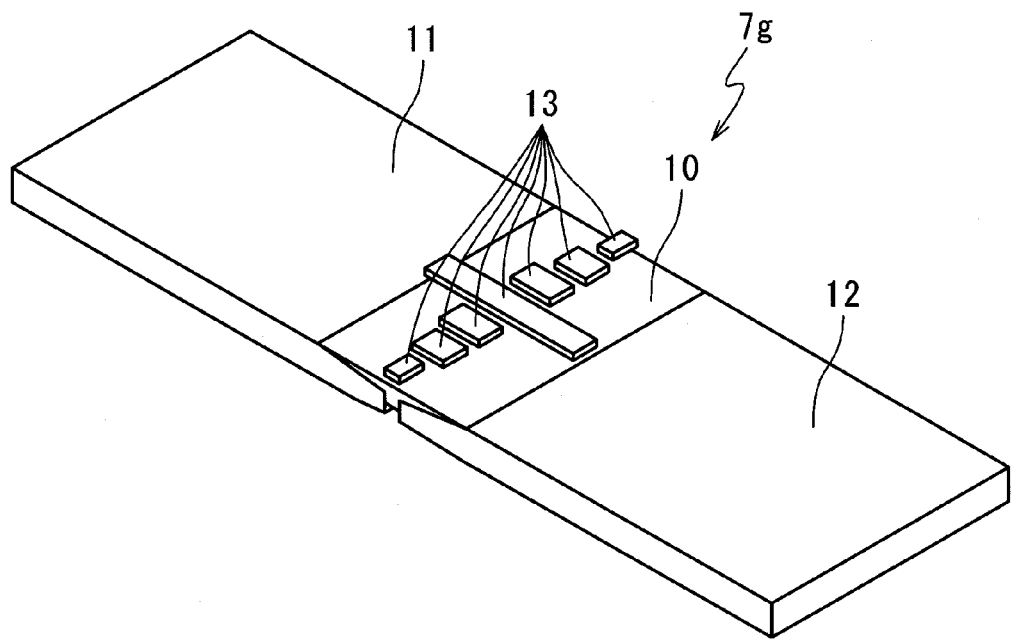
FIG. 15 is a perspective view of a magnetic detection element as sixth embodiment of the present invention.
Figure 16:
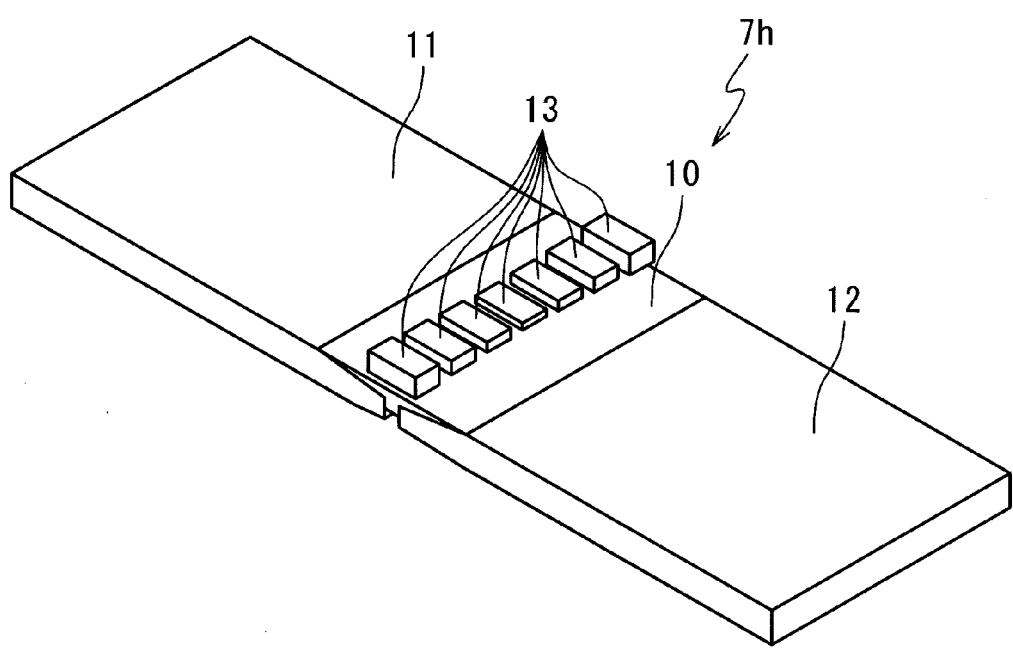
FIG. 16 is a perspective view of a magnetic detection element as seventh embodiment of the present invention.

Similarly to the above, in order to obtain the effect for enhancing linearity of the MR ratio by partially saturating the bypass portion 13 at different magnetic field intensity, as the magnetic detection element 7g of the sixth embodiment shown in FIG. 15, the bypass portion 13 may be formed in a divided manner as a plurality of separated parts respectively having different length in the direction of guiding magnetic flux. Also, as the magnetic detection element 7h of the seventh embodiment shown in FIG. 16, the bypass portion 13 may be formed with thickness varied in the widthwise direction.

Figure 17:
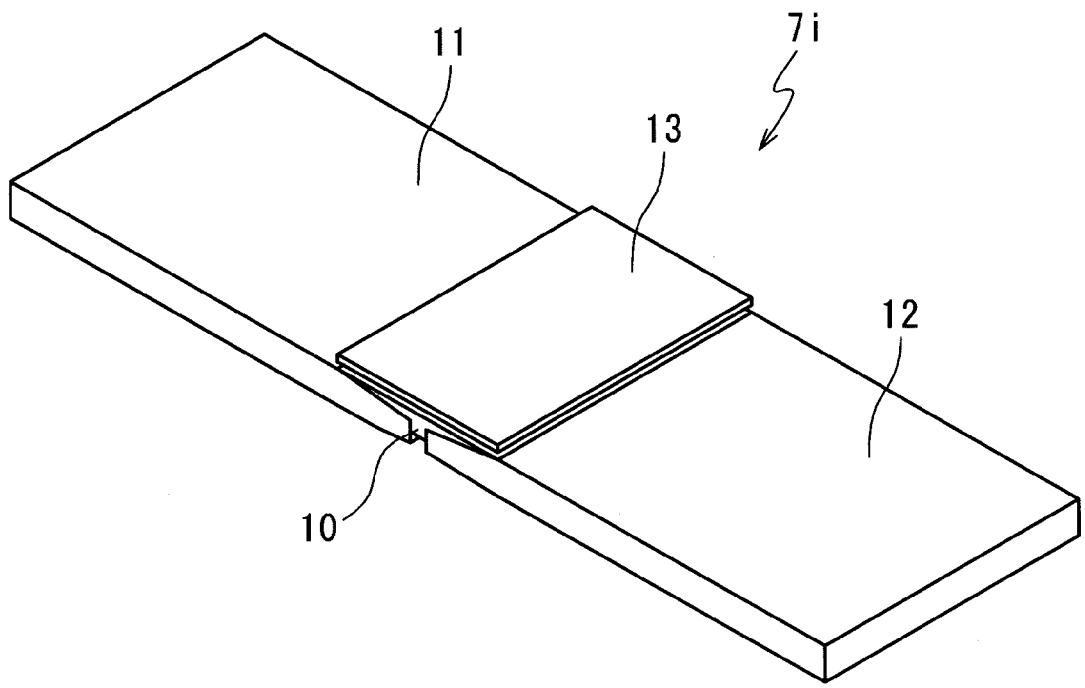
FIG. 17 is a perspective view of a magnetic detection element as eighth embodiment of the present invention.

Furthermore, in one or more embodiments of the present invention, by forming the bypass portion 13 from the different material, the characteristic of the profile of the electric resistance variation of the MR portion 10 with respect to the magnetic field intensity can also be altered. Here is examined a difference in MR ratio varying profile with forming the bypass portion 13 of a magnetic detection element 7i of the eighth embodiment shown in FIG. 17.

In the magnetic detection element 7i, the material and the shape of the MR portion 10 and the yoke portions 11, 12 are same with the above second embodiment. And, the bypass portion 13 has a length of 5 µm as same as the total length of the MR portion 10, a thickness of 0.2 µm, a width of 80 µm as same as the MR portion 10 and the yoke portions 11, 12, and a gap of 0.05 µm between with the MR portions 10.

Figure 18:
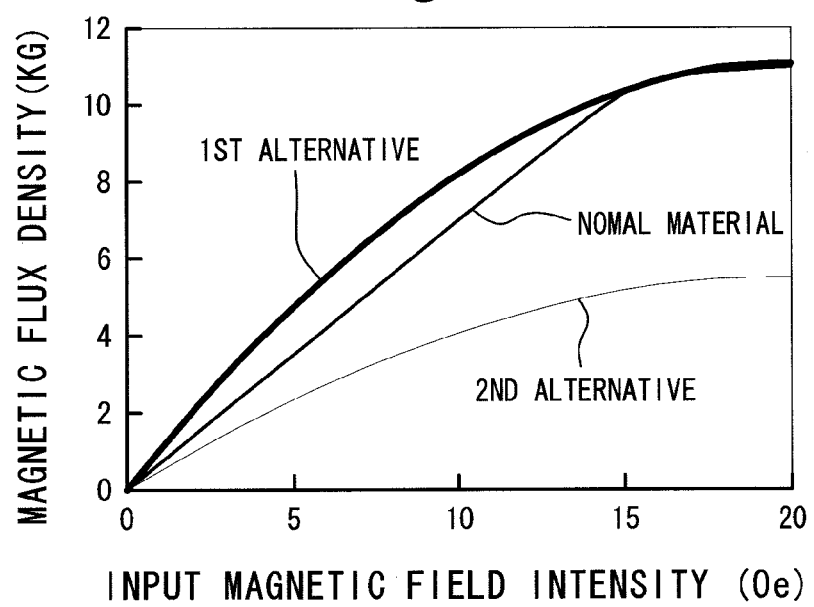
FIG. 18 is a B-H chart of a material forming the bypass portion of the magnetic detection element.

FIG. 18 shows B-H curves (profile of amount of magnetic flux with respect to magnetic field intensity) of three soft magnetic materials for forming the bypass portion 13. A normal material is a usual soft magnetic material film formed in an oriented magnetic field from metallic material as same as yoke portions 11, 12, for instance amorphous $CO_{78}Fe_4Si_9B_9$ films, similar to that in the above second embodiment. Therefore the normal material has a characteristic in which amount of magnetic flux linearly increases in proportion to increasing of magnetic field intensity and is saturated at a certain intensity of input magnetic field in which amount of magnetic flux linearly does not increases even if the input magnetic field increases. First alternative material has a same composition as the yoke portions 11, 12, but is formed in randomly oriented magnetic field to eliminate single axis induced magnetic anisotropy, different from conventional production methods for magnetic materials. As a result, the first alternative material has a non-linear B-H profile in which increasing rate of magnetic flux density with respect to input magnetic field increasing gets gradually lower. And, the second alternative material is that a material, such as $Co_{65}Fe_3Si_{15}B_{17}$, which is as the material used for the yoke portions 11, 12 with more added nonmagnetic material, such as Si, B and the like, is formed in a randomly oriented magnetic field. As a result, the second alternative material has a B-H profile that is as a compressed first alternative material to half in the direction of vertical axis, so that the magnetic flux density with respect to the input magnetic field intensity is half of the first alternative material.

Figure 19:
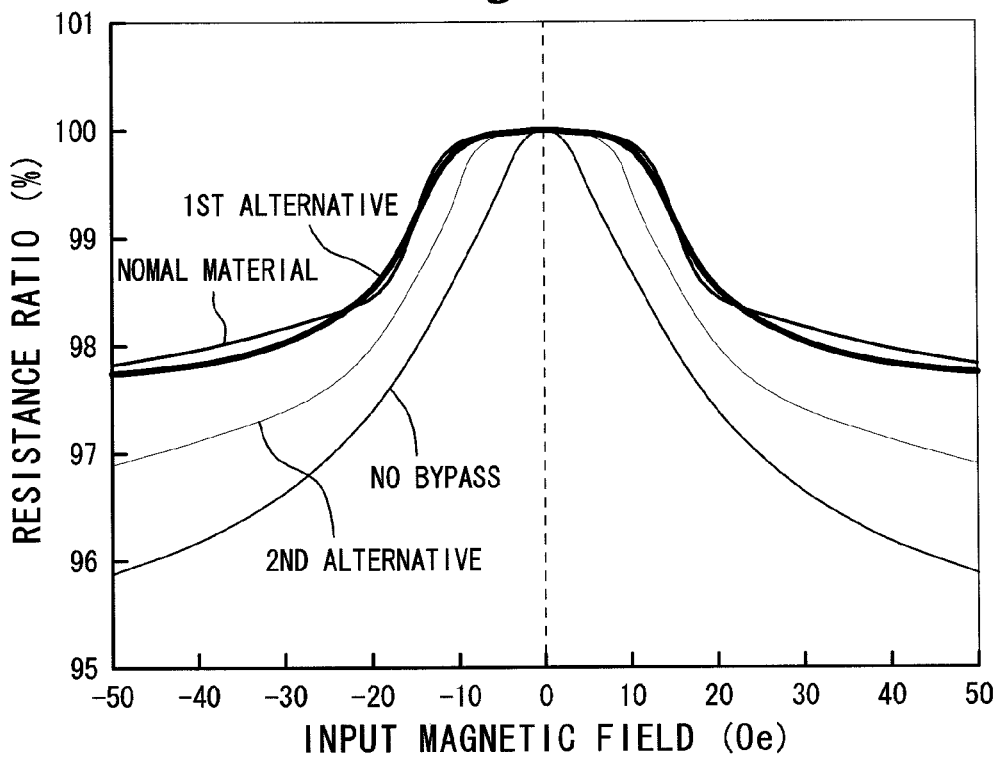
FIG. 19 is a chart showing variation of electric resistance of the magnetic detection element with the bypass portion made of different materials, with respect to magnetic field intensity.

FIG. 19 shows simulation results of profile of electric resistances (MR ratio) between the yoke portion 11 and yoke portion 12 including the MR portion with respect to magnetic field intensity with the magnetic detection elements 7i respectively with bypass portions formed from the materials of different magnetic characteristics shown in FIG. 18. As shown in the diagram, the bypass portion 13 made of the first alternative material can enhance the linearity of the MR ratio profile in comparison to the bypass portion 13 made from the normal material. It can be considered that the bypass portion 13 made of the second alternative material provides a MR ratio profile generally similar to the bypass portion 13 made from the first alternative material with a cross sectional area reduced in half.

As described above, by forming the bypass portion 13 from a soft magnetic material with a nonlinear B-H profile, the nonlinearity of the MR portion 10 and the yoke portions 11, 12 can be adequately canceled, to vary the electric resistance (MR ratio) between the yoke portion 11 and yoke portion 12 including the MR portion linearly with respect to magnetic field intensity. As methods for providing nonlinear B-H profile to the bypass portion 13, other than forming in a randomly oriented magnetic field, methods of heat treatment and methods for adjusting crystal size or orientation depending conditions of speed, temperature, atmosphere gas and the like of film formation. Further, with respect to the material composition, cobalt-iron amorphous and materials of nickel-iron, iron-silicone and silicon-aluminum can be used.

Figure 20:
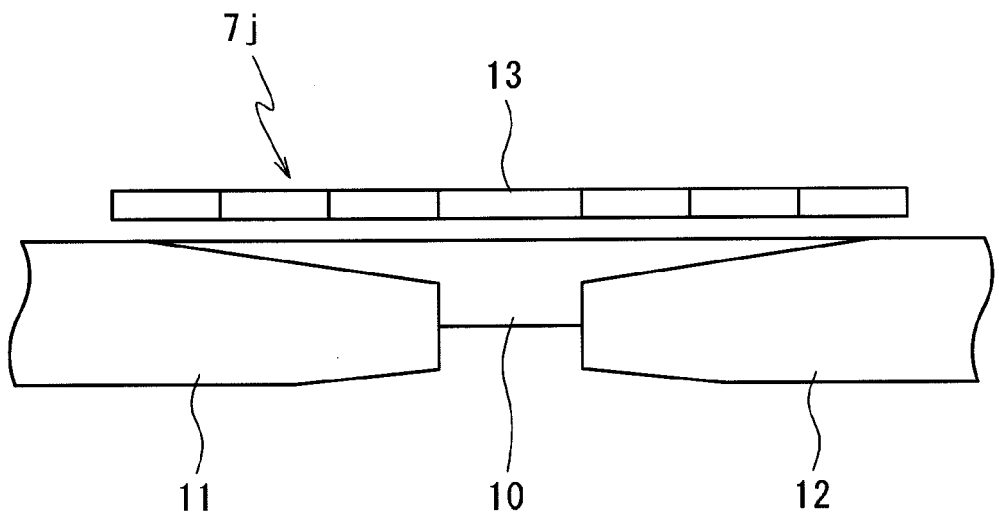
FIG. 20 is a side view of a magnetic detection element as ninth embodiment of the present invention.

Furthermore, as a magnetic detection element 7j of ninth embodiment of the present invention shown in FIG. 20, the bypass portion 13 may be formed by arranging a plurality of materials having different magnetic properties in a row in the direction of guiding magnetic flux. Thus, the bypass portion as whole can have more preferable property, that is, a characteristic capable of varying the bypassing amount with respect to variation of magnetic field intensity to compensate the linearity of the MR portion 10 and the yoke portions 11, 12 with respect to magnetic field intensity.

Figure 21:
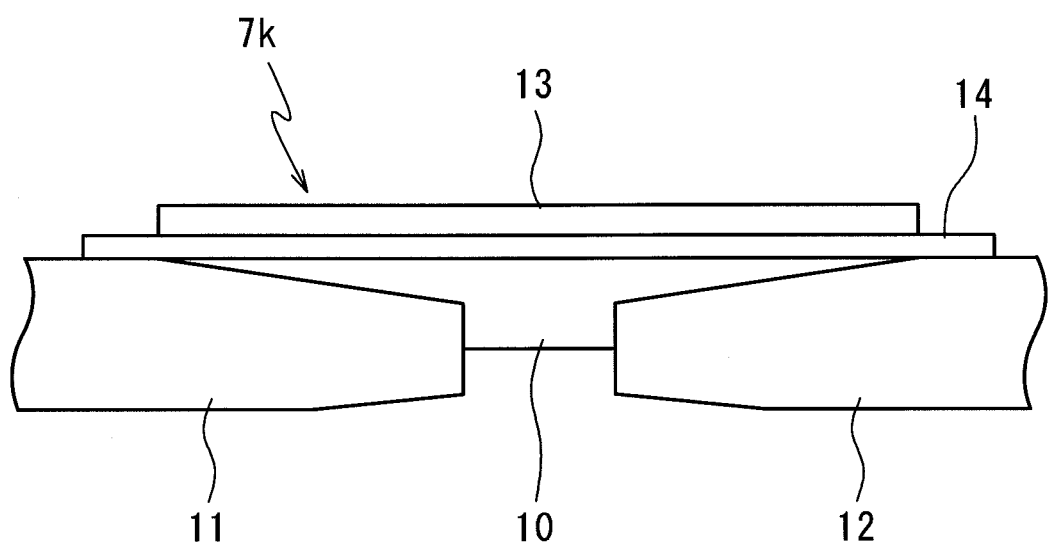
FIG. 21 is a side view of a magnetic detection element as tenth embodiment of the present invention.

Moreover, as a magnetic detection element 7k of tenth embodiment of the present invention shown in FIG. 21, by forming the insulation film (insulation layer) 14 which insulates the MR portion 10 and the yoke portions 11, 12 from each other from a semiconducting magnetic material having a very small electric conductivity, small magnetic conductivity and nonlinear magnetic property (B-H curve), amount of magnetic flux bypassed to the bypass portion 13 can be varied nonlinearly so as to compensate the linearity of the MR portion 10 and the yoke portions 11, 12 with respect to magnetic field intensity. As materials for this insulation film 14, it is cited, for instance, MnZn ferrite film, NiZn ferrite film, Cuzn ferrite film, CuZnMg ferrite film, and the like.

EXPLANATION OF REFERENCE

1 . . . signal transmission device
3a, 3b . . . excitation coil
7a-7k . . . magnetic detection element
10, 10a, 10b . . . magnetoresistance effect portion (MR portion)
11, 11a, 11b, 112, 12a, 12b . . . yoke portion
13, 13a, 13b . . . bypass portion
14 . . . insulation layer While the invention has been described with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. A signal transmission device comprising:
   a primary circuit having two coils which generate a magnetic field in accordance with the input electrical current,
   a secondary circuit which is magnetically coupled with the primary circuit and outputs an electric voltage in accordance with the primary input voltage,
   wherein the secondary circuit comprises a magnetic detection element comprising:
     a magnetoresistance effect portion composed of a magnetoresistance effect material,
     a pair of yoke portions which is composed of a soft magnetic material,
     wherein the pair of yoke portions is respectively arranged so as to be electrically connected to both sides of the magnetoresistance effect portion, and
     wherein the pair of yoke portions guide magnetic flux into the magnetoresistance effect portion; and a bypass portion which is composed of a soft magnetic material,
wherein the bypass portion is saturated with magnetic flux at lower magnetic field intensity than the yoke portions,
wherein the bypass portion guides a part of the magnetic flux generated in the yoke portions so as to divert the magnetic flux from the magnetoresistance effect portion,
wherein the magnetoresistance effect portion is made of $(FeCo)_{30}$—$(MgF_2)_{70}$ alloy,
wherein the yoke portions and the bypass portion are made of $Co_{78}Fe_4Si_9B_9$ alloy, and
wherein the sectional area of the bypass portion is smaller than the sectional area of the yoke portions.

2. The signal transmission device according to claim 1, wherein the bypass portion is electrically isolated from the magnetoresistance effect portion and the yoke portions.

3. The signal transmission device according to claim 1, wherein
the magnetoresistance effect portion and the yoke portions are formed in film like forms on a same plane,
the yoke portions are electrically connected to the both sides of the magnetoresistance effect portion, and
the bypass portion is formed in a film like form so as to lap at least partially over the magnetoresistance effect portion and to be spaced from the yoke portions.

4. The signal transmission device according to claim 1, wherein a reluctance of a magnetic path diverted from the magnetoresistance effect portion via the bypass portion is smaller than a reluctance of the magnetoresistance effect portion between the yoke portions at a magnetic field intensity which does not saturate the bypass portion with magnetic flux, so that magnetic flux density passing through the magnetoresistance effect portion is controlled.

5. The signal transmission device according to claim 1, wherein the secondary circuit comprises a bridge circuit which has two magnetic detection elements and two fixed resistances arranged opposed to the two magnetic detection elements respectively.

6. The signal transmission device according to claim 5, wherein the two coils are arranged so as to surround the magnetic detection elements.

7. The signal transmission device according to claim 1, wherein the yoke portions have lower specific resistances than the magnetoresistance effect material to function also as electrodes to supply current to the magnetoresistance effect portions.

8. The signal transmission device according to claim 1, wherein
the yoke portions are constituted of a tapered portion which thickness of each end portion facing to each other with a gap gradually becomes thinner toward the end,
the magnetoresistance effect portion is formed by filling magnetoresistance effect material into a region from the tapered portion to the middle of the gap,
the bypass portion is formed so as to lap over the magnetoresistance effect potion with interposition of an isolation film.

9. The signal transmission device according to claim 1, wherein by choosing the ratio between the cross sectional area of the bypass portion and the cross sectional area of the yoke potions, the balance between the reluctance of the magnetic path via the bypass portion and the reluctance of the magnetic path via the magnetoresistance effect portion are adjusted.

10. The signal transmission device according to claim 1, wherein by choosing the size of the gap between the cross sectional area of the bypass portion and the cross sectional area of the yoke potions, the balance between the reluctance of the magnetic path via bypass portion and the reluctance of the magnetic path via magnetoresistance effect portion are adjusted.

11. A signal transmission device comprising:
a primary circuit having two coils which generate a magnetic field in accordance with the input electrical current,
a secondary fit which is magnetically coupled with the primary circuit and outputs an electric voltage in accordance with the primary input voltage,
wherein the secondary circuit comprises a magnetic detection element comprising:
a magnetoresistance effect portion composed of a magnetoresistance effect material,
a pair of yoke portions which is composed of a soft magnetic material,
wherein the pair of yoke portions is respectively arranged so as to be electrically connected to both sides of the magnetoresistance effect portion, and
wherein the pair of yoke portions guide magnetic flux into the magnetoresistance effect portion; and
a bypass portion which is composed of a soft magnetic material,
wherein the bypass portion is saturated with magnetic flux at lower magnetic field intensity than the yoke portions,
wherein the bypass portion guides apart of the magnetic flux generated in the yoke portions so as to divert the magnetic flux from the magnetoresistance effect portion, and
wherein the bypass portion is formed so as to lap over only the gap portion of the magnetoresistance effect portion and has a generally cross star shape of which gets longer as at more inside in the direction of guiding of the magnetic flux.

12. A signal transmission device comprising:
a primary circuit having two coils which generate a magnetic field in accordance with the input electrical current,
a secondary circuit which is magnetically coupled with the primary circuit and outputs an electric voltage in accordance with the primary input voltage,
wherein the secondary circuit comprises a magnetic detection element comprising:
a magnetoresistance effect portion composed of a magnetoresistance effect material
a pair of yoke portions which is composed of a soft magnetic material,
wherein the pair of yoke portions is respectively arranged so as to be electrically connected to both sides of the magnetoresistance effect portion, and
wherein the pair of yoke portions guide magnetic flux into the magnetoresistance effect portion; and
a bypass portion which is composed of a soft magnetic material,
wherein the bypass portion is saturated with magnetic flux at lower magnetic field intensity than the yoke portions,
wherein the bypass portion guides a magnetic flux generated in the yoke portions so as to divert the magnetic flux from the magnetoresistance effect portion, and
wherein the bypass portion is made of the material which eliminate single axis induced magnetic anisotropy.

13. A signal transmission device comprising:
a primary circuit having two coils which generate a magnetic field in accordance with the input electrical current,
a secondary circuit which is magnetically coupled with the primary circuit and outputs an electric voltage in accordance with the primary input voltage,
wherein the secondary circuit comprises a magnetic detection element comprising:
 a magnetoresistance effect portion composed of a magnetoresistance effect material,
 a pair of yoke portions which is composed of a soft magnetic material,
 wherein the pair of yoke portions is respectively arranged so as to be electrically connected to both sides of the magnetoresistance effect portion, and
 wherein the pair of yoke portions guide magnetic flux into the magnetoresistance effect portion; and
 a bypass portion which is composed of a soft magnetic material,
 wherein the bypass portion is saturated with magnetic flux at lower magnetic field intensity than the yoke portions,
 wherein the bypass portion guides a part of the magnetic flux generated in the yoke portions so as to divert the magnetic flux from the magnetoresistance effect portion, and
 wherein the bypass portion is made of the material which adds the material forming the yoke portion to nonmagnetic element.

14. A signal transmission device comprising:
a primary circuit having two coils which generate a magnetic field in accordance with the input electrical current,
a secondary circuit which is magnetically coupled with the primary circuit and outputs an electric voltage in accordance with the primary input voltage,
wherein the secondary circuit comprises a magnetic detection element comprising:
 a magnetoresistance effect portion composed of a magnetoresistance effect material
 a pair of yoke portions which is composed of a soft magnetic material,
 wherein the pair of yoke portions is respectively arranged so as to be electrically connected to both sides of the magnetoresistance effect portion, and
 wherein the pair of yoke portions guide magnetic flux into the magnetoresistance effect portion; and
 a bypass portion which is composed of a soft magnetic material,
 wherein the bypass portion is saturated with magnetic flux at lower magnetic field intensity than the yoke portions,
 wherein the bypass portion guides a part of the magnetic flux generated in the yoke portions so as to divert the magnetic flux from the magnetoresistance effect portion, and
 wherein the isolation film of the bypass portion and the yoke portions has smaller electronic conductivity and magnetic conductivity than the bypass portion and the yoke portions, and is made of semiconducting material which magnetic property is nonlinear.

15. The signal transmission device according to claim 11, wherein the bypass portion is electrically isolated from the magnetoresistance effect portion and the yoke portions.

16. The signal transmission device according to claim 11, wherein
the magnetoresistance effect portion and the yoke portions are formed in film like forms on a same plane,
the yoke portions are electrically connected to the both sides of the magnetoresistance effect portion, and
the bypass portion is formed in a film like form so as to lap at least partially over the magnetoresistance effect portion and to be spaced from the yoke portions.

17. The signal transmission device according to claim 11, wherein a reluctance of a magnetic path diverted from the magnetoresistance effect portion via the bypass portion is smaller than a reluctance of the magnetoresistance effect portion between the yoke portions at a magnetic field intensity which does not saturate the bypass portion with magnetic flux, so that magnetic flux density passing through the magnetoresistance effect portion is controlled.

18. The signal transmission device according to claim 11, wherein the secondary circuit comprises a bridge circuit which has two magnetic detection elements and two fixed resistances arranged opposed to the two magnetic detection elements respectively.

19. The signal transmission device according to claim 18, wherein the two coils are arranged so as to surround the magnetic detection elements.

20. The signal transmission device according to claim 11, wherein the yoke portions have lower specific resistances than the magnetoresistance effect material to function also as electrodes to supply current to the magnetoresistance effect portions.

21. The signal transmission device according to claim 11, wherein
the yoke portions are constituted of a tapered portion which thickness of each end portion facing to each other with a gap gradually becomes thinner toward the end,
the magnetoresistance effect portion is formed by filling magnetoresistance effect material into a region from the tapered portion to the middle of the gap,
the bypass portion is formed so as to lap over the magnetoresistance effect potion with interposition of an isolation film.

22. The signal transmission device according to claim 11, wherein by choosing the ratio between the cross sectional area of the bypass portion and the cross sectional area of the yoke potions, the balance between the reluctance of the magnetic path via the bypass portion and the reluctance of the magnetic path via the magnetoresistance effect portion are adjusted.

23. The signal transmission device according to claim 11, wherein by choosing the size of the gap between the cross sectional area of the bypass portion and the cross sectional area of the yoke potions, the balance between the reluctance of the magnetic path via bypass portion and the reluctance of the magnetic path via magnetoresistance effect portion are adjusted.

24. The signal transmission device according to claim 12, wherein the bypass portion is electrically isolated from the magnetoresistance effect portion and the yoke portions.

25. The signal transmission device according to claim 12, wherein
the magnetoresistance effect portion and the yoke portions are formed in film like forms on a same plane,
the yoke portions are electrically connected to the both sides of the magnetoresistance effect portion, and
the bypass portion is formed in a film like form so as to lap at least partially over the magnetoresistance effect portion and to be spaced from the yoke portions.

26. The signal transmission device according to claim 12, wherein a reluctance of a magnetic path diverted from the magnetoresistance effect portion via the bypass portion is smaller than a reluctance of the magnetoresistance effect portion between the yoke portions at a magnetic field intensity which does not saturate the bypass portion with magnetic flux, so that magnetic flux density passing through the magnetoresistance effect portion is controlled.

27. The signal transmission device according to claim 12, wherein the secondary circuit comprises a bridge circuit which has two magnetic detection elements and two fixed resistances arranged opposed to the two magnetic detection elements respectively.

28. The signal transmission device according to claim 27, wherein the two coils are arranged so as to surround the magnetic detection elements.

29. The signal transmission device according to claim 12, wherein the yoke portions have lower specific resistances than the magnetoresistance effect material to function also as electrodes to supply current to the magnetoresistance effect portions.

30. The signal transmission device according to claim 12, wherein
the yoke portions are constituted of a tapered portion which thickness of each end portion facing to each other with a gap gradually becomes thinner toward the end,
the magnetoresistance effect portion is formed by filling magnetoresistance effect material into a region from the tapered portion to the middle of the gap,
the bypass portion is formed so as to lap over the magnetoresistance effect potion with interposition of an isolation film.

31. The signal transmission device according to claim 12, wherein by choosing the ratio between the cross sectional area of the bypass portion and the cross sectional area of the yoke potions, the balance between the reluctance of the magnetic path via the bypass portion and the reluctance of the magnetic path via the magnetoresistance effect portion are adjusted.

32. The signal transmission device according to claim 12, wherein by choosing the size of the gap between the cross sectional area of the bypass portion and the cross sectional area of the yoke potions, the balance between the reluctance of the magnetic path via bypass portion and the reluctance of the magnetic path via magnetoresistance effect portion are adjusted.

33. The signal transmission device according to claim 13, wherein the bypass portion is electrically isolated from the magnetoresistance effect portion and the yoke portions.

34. The signal transmission device according to claim 13, wherein
the magnetoresistance effect portion and the yoke portions are formed in film like forms on a same plane,
the yoke portions are electrically connected to the both sides of the magnetoresistance effect portion, and
the bypass portion is formed in a film like form so as to lap at least partially over the magnetoresistance effect portion and to be spaced from the yoke portions.

35. The signal transmission device according to claim 13, wherein a reluctance of a magnetic path diverted from the magnetoresistance effect portion via the bypass portion is smaller than a reluctance of the magnetoresistance effect portion between the yoke portions at a magnetic field intensity which does not saturate the bypass portion with magnetic flux, so that magnetic flux density passing through the magnetoresistance effect portion is controlled.

36. The signal transmission device according to claim 13, wherein the secondary circuit comprises a bridge circuit which has two magnetic detection elements and two fixed resistances arranged opposed to the two magnetic detection elements respectively.

37. The signal transmission device according to claim 36, wherein the two coils are arranged so as to surround the magnetic detection elements.

38. The signal transmission device according to claim 13, wherein the yoke portions have lower specific resistances than the magnetoresistance effect material to function also as electrodes to supply current to the magnetoresistance effect portions.

39. The signal transmission device according to claim 13, wherein
the yoke portions are constituted of a tapered portion which thickness of each end portion facing to each other with a gap gradually becomes thinner toward the end,
the magnetoresistance effect portion is formed by filling magnetoresistance effect material into a region from the tapered portion to the middle of the gap,
the bypass portion is formed so as to lap over the magnetoresistance effect potion with interposition of an isolation film.

40. The signal transmission device according to claim 13, wherein by choosing the ratio between the cross sectional area of the bypass portion and the cross sectional area of the yoke potions, the balance between the reluctance of the magnetic path via the bypass portion and the reluctance of the magnetic path via the magnetoresistance effect portion are adjusted.

41. The signal transmission device according to claim 13, wherein by choosing the size of the gap between the cross sectional area of the bypass portion and the cross sectional area of the yoke potions, the balance between the reluctance of the magnetic path via bypass portion and the reluctance of the magnetic path via magnetoresistance effect portion are adjusted.

42. The signal transmission device according to claim 14, wherein the bypass portion is electrically isolated from the magnetoresistance effect portion and the yoke portions.

43. The signal transmission device according to claim 14, wherein
the magnetoresistance effect portion and the yoke portions are formed in film like forms on a same plane,
the yoke portions are electrically connected to the both sides of the magnetoresistance effect portion, and
the bypass portion is formed in a film like form so as to lap at least partially over the magnetoresistance effect portion and to be spaced from the yoke portions.

44. The signal transmission device according to claim 14, wherein a reluctance of a magnetic path diverted from the magnetoresistance effect portion via the bypass portion is smaller than a reluctance of the magnetoresistance effect portion between the yoke portions at a magnetic field intensity which does not saturate the bypass portion with magnetic flux, so that magnetic flux density passing through the magnetoresistance effect portion is controlled.

45. The signal transmission device according to claim 14, wherein the secondary circuit comprises a bridge circuit which has two magnetic detection elements and two fixed resistances arranged opposed to the two magnetic detection elements respectively.

46. The signal transmission device according to claim 45, wherein the two coils are arranged so as to surround the magnetic detection elements.

47. The signal transmission device according to claim 14, wherein the yoke portions have lower specific resistances than the magnetoresistance effect material to function also as electrodes to supply current to the magnetoresistance effect portions.

48. The signal transmission device according to claim 14, wherein
- the yoke portions are constituted of a tapered portion which thickness of each end portion facing to each other with a gap gradually becomes thinner toward the end,
- the magnetoresistance effect portion is formed by filling magnetoresistance effect material into a region from the tapered portion to the middle of the gap,
- the bypass portion is formed so as to lap over the magnetoresistance effect potion with interposition of an isolation film.

49. The signal transmission device according to claim 14, wherein by choosing the ratio between the cross sectional area of the bypass portion and the cross sectional area of the yoke potions, the balance between the reluctance of the magnetic path via the bypass portion and the reluctance of the magnetic path via the magnetoresistance effect portion are adjusted.

50. The signal transmission device according to claim 14, wherein by choosing the size of the gap between the cross sectional area of the bypass portion and the cross sectional area of the yoke potions, the balance between the reluctance of the magnetic path via bypass portion and the reluctance of the magnetic path via magnetoresistance effect portion are adjusted.

* * * * *

UNITED STATES PATENT AND TRADEMARK OFFICE
CERTIFICATE OF CORRECTION

| | |
|---|---|
| PATENT NO. | : 8,963,544 B2 |
| APPLICATION NO. | : 13/062818 |
| DATED | : February 24, 2015 |
| INVENTOR(S) | : Hirofumi Imatani et al. |

It is certified that error appears in the above-identified patent and that said Letters Patent is hereby corrected as shown below:

Title page, Item (75) Inventors: The residence "Kusata (JP)" for inventor Hirofumi Imatani should read -- Kusatsu (JP) --

Signed and Sealed this
Fifteenth Day of September, 2015

Michelle K. Lee
*Director of the United States Patent and Trademark Office*